(12) United States Patent
Kim et al.

(10) Patent No.: US 12,302,576 B2
(45) Date of Patent: May 13, 2025

(54) INTEGRATED CIRCUIT DEVICE AND ELECTRONIC SYSTEM INCLUDING THE SAME

(71) Applicant: Samsung Electronics Co., Ltd., Suwon-si (KR)

(72) Inventors: Jeeyong Kim, Hanam-si (KR); Junghwan Lee, Seoul (KR); Hwanyeol Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 786 days.

(21) Appl. No.: 17/648,134

(22) Filed: Jan. 17, 2022

(65) Prior Publication Data

US 2022/0262819 A1    Aug. 18, 2022

(30) Foreign Application Priority Data

Feb. 17, 2021    (KR) ........................ 10-2021-0021137

(51) Int. Cl.
*H10B 43/27*    (2023.01)
*H01L 23/00*    (2006.01)
(Continued)

(52) U.S. Cl.
CPC ............. *H10B 43/40* (2023.02); *H01L 24/08* (2013.01); *H01L 25/0652* (2013.01);
(Continued)

(58) Field of Classification Search
CPC ........ H10B 43/27; H10B 41/10; H10B 41/27; H10B 41/35; H10B 41/41; H10B 43/10; H10B 43/35; H10B 43/40; H10B 43/50; H10B 43/20; H10B 43/30; H01L 24/08; H01L 25/0652; H01L 2224/08147; (Continued)

(56) References Cited

U.S. PATENT DOCUMENTS 9,343,292 B2 *  5/2016  Hasebe ................ H01L 21/022
9,911,745 B2    3/2018  Lee et al.
(Continued)

FOREIGN PATENT DOCUMENTS

CN    107895724 A    4/2018

*Primary Examiner* — Yara B Green
*Assistant Examiner* — Akhee Sarker-Nag
(74) *Attorney, Agent, or Firm* — Myers Bigel, P.A.

(57) ABSTRACT

An integrated circuit device includes: a semiconductor substrate having a cell region and a dummy region outside the cell region, a plurality of gate electrodes and a plurality of insulating layers, in the cell region, extending in first and second directions parallel to a main surface of the semiconductor substrate and alternately stacked in a third direction perpendicular to the main surface of the semiconductor substrate, the first and second directions crossing each other, and a plurality of dummy mold layers and a plurality of dummy insulating layers alternately stacked in the dummy region in the third direction, wherein a carbon concentration of an upper dummy mold layer of the plurality of dummy mold layers is less than a carbon concentration of a lower dummy mold layer of the plurality of dummy mold layers, the lower dummy mold layer being between the upper dummy mold layer and the main surface of the semiconductor substrate.

20 Claims, 21 Drawing Sheets

(51) Int. Cl.
   *H01L 25/065*   (2023.01)
   *H10B 41/10*   (2023.01)
   *H10B 41/27*   (2023.01)
   *H10B 41/35*   (2023.01)
   *H10B 41/41*   (2023.01)
   *H10B 43/10*   (2023.01)
   *H10B 43/35*   (2023.01)
   *H10B 43/40*   (2023.01)

(52) U.S. Cl.
   CPC ............ *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H01L 2224/08147* (2013.01); *H01L 2225/06506* (2013.01); *H01L 2225/0651* (2013.01); *H01L 2225/06524* (2013.01); *H01L 2225/06541* (2013.01); *H01L 2225/06562* (2013.01)

(58) Field of Classification Search
   CPC ... H01L 2225/06506; H01L 2225/0651; H01L 2225/06524; H01L 2225/06541; H01L 2225/06562; H01L 25/18; H01L 2224/0603; H01L 2224/08145; H01L 2224/16227; H01L 2224/32145; H01L 2224/32225; H01L 2224/48145; H01L 2224/48227; H01L 2224/73265; H01L 2225/06527; H01L 2225/06586; H01L 29/42324; H01L 29/4234; H01L 29/788; H01L 29/792

See application file for complete search history.

(56) References Cited

U.S. PATENT DOCUMENTS

| | | |
|---|---|---|
| 10,354,860 B2 | 7/2019 | Li et al. |
| 10,468,244 B2 | 11/2019 | Li et al. |
| 2015/0102399 A1* | 4/2015 | Sakuma ................ H10B 43/27 257/324 |
| 2017/0069655 A1 | 3/2017 | Ichinose et al. |
| 2017/0117290 A1* | 4/2017 | Lee ........................ H10B 43/40 |
| 2022/0254792 A1* | 8/2022 | Kim ........................ H10B 41/27 |

* cited by examiner

INTEGRATED CIRCUIT DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2021-0021137, filed on Feb. 17, 2021 in the Korean Intellectual Property Office, the disclosure of which is incorporated by reference herein in its entirety.

BACKGROUND

Embodiments of the inventive concept relate to an integrated circuit device and an electronic system including the integrated circuit device, and, more particularly, to an integrated circuit device including a non-volatile vertical memory device and an electronic system including the integrated circuit device.

To improve performance and economic efficiency, it may be necessary to increase the degree of integration of integrated circuit devices. In particular, the degree of integration of memory devices is a factor in determining the economic efficiency of a product. Because the degree of integration of a two-dimensional memory device may be determined by an area occupied by a unit memory cell, it may be influenced by the level of fine pattern formation technology. However, expensive equipment may be required to form a fine pattern and the areas of chip dies are limited, and thus, although the degree of integration of two-dimensional memory devices is generally increasing, it may still limited.

SUMMARY

The inventive concept may provide an integrated circuit device, which is manufactured by performing an annealing process using ultraviolet rays on an upper mold layer in a vertical memory device and thus may effectively suppress over-etching defects that may occur due to impurities in a process of forming a channel hole, and an electronic system including the integrated circuit device.

According to an aspect of the inventive concept, there is provided an integrated circuit device including: a semiconductor substrate having a cell region and a dummy region outside the cell region, a plurality of gate electrodes and a plurality of insulating layers, in the cell region, extending in first and second directions parallel to a main surface of the semiconductor substrate and alternately stacked in a third direction perpendicular to the main surface, the first and second directions crossing each other, a plurality of dummy mold layers and a plurality of dummy insulating layers alternately stacked in the dummy region in the third direction, a plurality of channel structures passing through the plurality of gate electrodes and the plurality of insulating layers in the cell region, and a plurality of dummy structures passing through the plurality of dummy mold layers and the plurality of dummy insulating layers in the dummy region, wherein the plurality of dummy mold layers are arranged at a same level as the plurality of gate electrodes in the third direction, the plurality of dummy insulating layers are arranged at a same level as the plurality of insulating layers in the third direction, and a carbon concentration of an upper dummy mold layer of the plurality of dummy mold layers is less than a carbon concentration of a lower dummy mold layer of the plurality of dummy mold layers, the lower dummy mold layer being between the upper dummy mold layer and the main surface of the semiconductor substrate.

According to another aspect of the inventive concept, there is provided an integrated circuit device including: a semiconductor substrate having a cell region and a dummy region, a plurality of gate electrodes and a plurality of insulating layers alternately stacked in the cell region in a direction perpendicular to a main surface of the semiconductor substrate, a plurality of dummy mold layers and a plurality of dummy insulating layers alternately stacked in the dummy region in the direction perpendicular to the main surface, and a channel hole passing through the plurality of gate electrodes and the plurality of insulating layers in the cell region, and a dummy hole passing through the plurality of dummy mold layers and the plurality of dummy insulating layers in the dummy region, wherein, in at least one dummy mold layer of the plurality of dummy mold layers, a carbon concentration at each of an upper interface and a lower interface of the at least one dummy mold layer is greater than a carbon concentration of a central portion of the at least one dummy mold layer.

According to another aspect of the inventive concept, there is provided an electronic system including: a main substrate, an integrated circuit device on the main substrate, and a controller electrically connected to the integrated circuit device on the main substrate, wherein the integrated circuit device includes: a semiconductor substrate having a cell region and a dummy region outside the cell region, a plurality of gate electrodes and a plurality of insulating layers, in the cell region, extending in first and second directions parallel to a main surface of the semiconductor substrate and alternately stacked in a third direction perpendicular to the main surface, the first and second directions crossing each other, a plurality of dummy mold layers and a plurality of dummy insulating layers alternately stacked in the dummy region in the third direction, a plurality of channel structures passing through the plurality of gate electrodes and the plurality of insulating layers in the cell region, and a plurality of dummy structures passing through the plurality of dummy mold layers and the plurality of dummy insulating layers in the dummy region, wherein the plurality of dummy mold layers are arranged at a same level as the plurality of gate electrodes in the third direction, the plurality of dummy insulating layers are arranged at a same level as the plurality of insulating layers in the third direction, and a carbon concentration of an upper dummy mold layer of the plurality of dummy mold layers is less than a carbon concentration of a lower dummy mold layer of the plurality of dummy mold layers, the lower dummy mold layer being between the upper dummy mold layer and the main surface of the semiconductor substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. Hereinafter, embodiments of the inventive concept will be described in detail with reference to the accompanying drawings.

Figure 1:
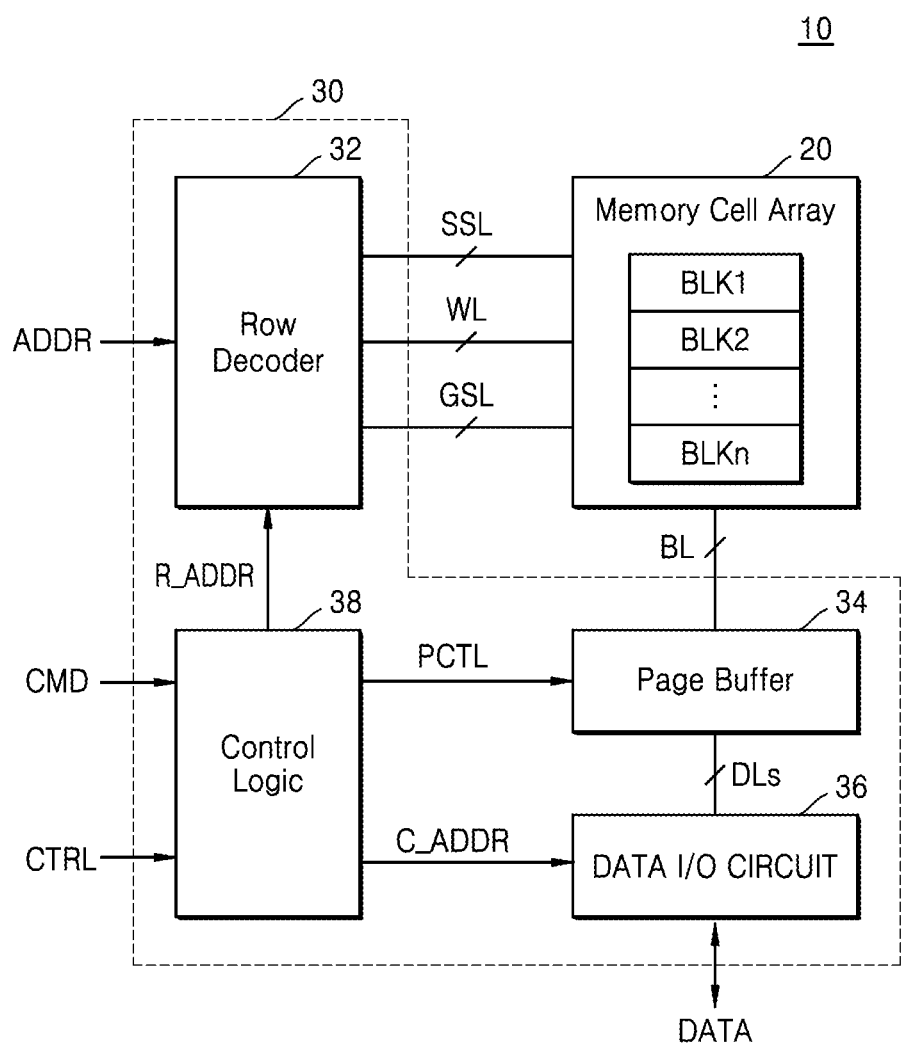
FIG. 1 is a block diagram of an integrated circuit device according to some embodiments of the inventive concept.

FIG. 1 is a block diagram of an integrated circuit device 10 according to some embodiments of the inventive concept.

Referring to FIG. 1, the integrated circuit device 10 may include a memory cell array 20 and a peripheral circuit 30.

The memory cell array 20 may include a plurality of memory cell blocks BLK1, BLK2, ..., and BLKn (where n is an integer of 3 or more). The plurality of memory cell blocks BLK1, BLK2, ..., and BLKn may each include a plurality of memory cells. The plurality of memory cell blocks BLK1, BLK2, ..., and BLKn may be connected to the peripheral circuit 30 through a bit line BL, a word line WL, a string selection line SSL, and a ground selection line GSL.

The memory cell array 20 may be connected to a page buffer 34 through the bit line BL and may be connected to a row decoder 32 through the word line WL, the string selection line SSL, and the ground selection line GSL. In the memory cell array 20, each of the plurality of memory cells included in the plurality of memory cell blocks BLK1, BLK2, ..., and BLKn may include a flash memory cell. The memory cell array 20 may include a three-dimensional (3D) memory cell array. The 3D memory cell array may include a plurality of NAND strings, and each of the plurality of NAND strings may include a plurality of memory cells connected to a plurality of word lines WL, which are vertically stacked.

The peripheral circuit 30 may include the row decoder 32, the page buffer 34, a data input/output (I/O) circuit 36, and a control logic 38. Although not shown in the drawings, the peripheral circuit 30 may further include various circuits, such as a voltage generating circuit configured to generate various voltages used in operating the integrated circuit device 10, an error correction circuit configured to correct an error in data read from the memory cell array 20, and an I/O interface.

The peripheral circuit 30 may receive an address ADDR, a command CMD, and a control signal CTRL from outside of or external to the integrated circuit device 10 and may transmit and receive data DATA and from an external device outside of the integrated circuit device 10.

A configuration of the peripheral circuit 30 will be described below in detail.

The row decoder 32 may be configured to select at least one memory cell block from among the plurality of memory cell blocks BLK1, BLK2, ..., and BLKn in response to the address ADDR from the outside and may be configured to select a word line WL, a string selection line SSL, and a ground selection line GSL of the selected memory cell block. The row decoder 32 may provide the word line WL of the selected memory cell block with a voltage for performing a memory operation.

The page buffer 34 may be connected to the memory cell array 20 through the bit line BL. In a program operation, the page buffer 34 may be configured to operate as a write driver to apply a voltage, based on the data DATA, which is to be stored in the memory cell array 20, to the bit line BL, and in a read operation, the page buffer 34 may be configured to operate as a sense amplifier to sense the data DATA stored in the memory cell array 20. The page buffer 34 may be configured to operate based on a control signal PCTL provided from the control logic 38.

The data I/O circuit 36 may be connected to the page buffer 34 through a plurality of data lines DLs. In a program operation, the data I/O circuit 36 may be configured to receive the data DATA from a memory controller (not shown), and based on a column address C_ADDR provided from the control logic 38, the data I/O circuit 36 may be configured to provide program data DATA to the page buffer 34. In a read operation, the data I/O circuit 36 may be configured to provide the memory controller with read data DATA stored in the page buffer 34 on the basis of the column address C_ADDR provided from the control logic 38. The data I/O circuit 36 may be configured to transfer an address or a command, input thereto, to the control logic 38 or the row decoder 32.

The control logic 38 may be configured to receive the command CMD and the control signal CTRL from the memory controller. The control logic 38 may be configured to provide a row address R_ADDR to the row decoder 32 and may be configured to provide the column address C_ADDR to the data I/O circuit 36. The control logic 38 may be configured to generate various internal control signals used in the integrated circuit device 10 in response to the control signal CTRL. For example, the control logic 38 may be configured to adjust a voltage level provided to the word line WL and the bit line BL in performing a memory operation, such as a program operation or an erase operation.

Figure 2:
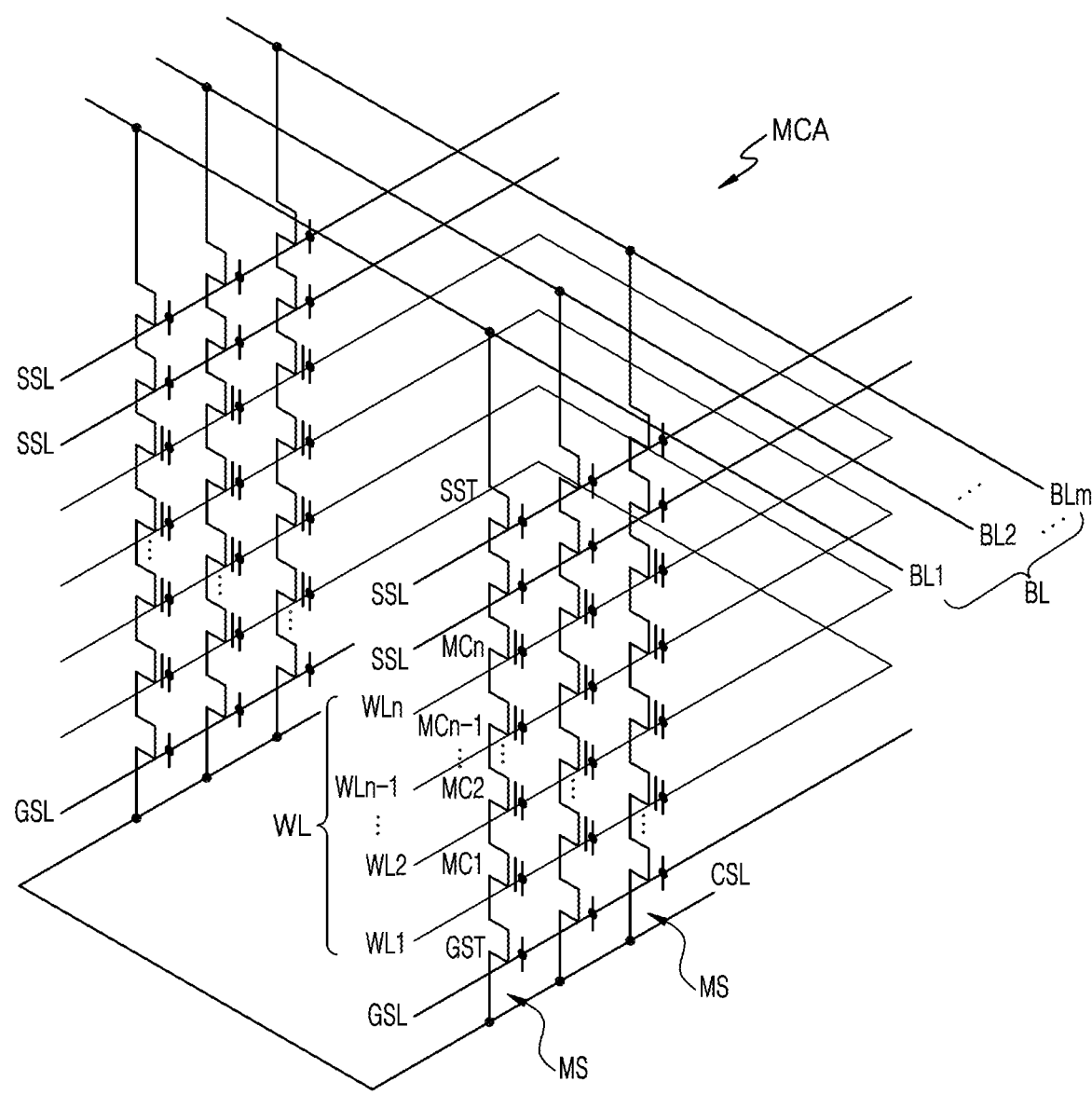
FIG. 2 is an equivalent circuit diagram of a memory cell array of an integrated circuit device according to some embodiments of the inventive concept.

FIG. 2 is an equivalent circuit diagram of a memory cell array MCA of an integrated circuit device according to some embodiments of the inventive concept.

Referring to FIG. 2, an equivalent circuit diagram of a vertical NAND flash memory having a vertical channel structure is illustrated.

The memory cell array MCA may include a plurality of memory cell strings MS. The memory cell array MCA may include a plurality of bit lines BL, a plurality of word lines WL, at least one string selection line SSL, at least one ground selection line GSL, and a common source line CSL.

A plurality of memory cell strings MS may be formed between the plurality of bit lines BL and the common source line CSL. In the drawing, an example where each of the plurality of memory cell strings MS includes two string selection lines SSL is illustrated, but embodiments of the inventive concept are not limited thereto. For example, the plurality of memory cell strings MS may each include one string selection line SSL.

The plurality of memory cell strings MS may each include a string selection transistor SST, a ground selection transistor GST, and a plurality of memory cell transistors MC1, MC2, . . . , MCn−1, and MCn. A drain region of the string selection transistor SST may be connected to a bit line BL, and a source region of the ground selection transistor GST may be connected to the common source line CSL. The common source line CSL may be a region, which is connected to source regions of a plurality of ground selection transistors GST in common.

The string selection transistor SST may be connected to the string selection line SSL, and the ground selection transistor GST may be connected to the ground selection line GSL. The plurality of memory cell transistors MC1, MC2, . . . , MCn−1, and MCn may be respectively connected to a plurality of word lines WL.

Figure 3:
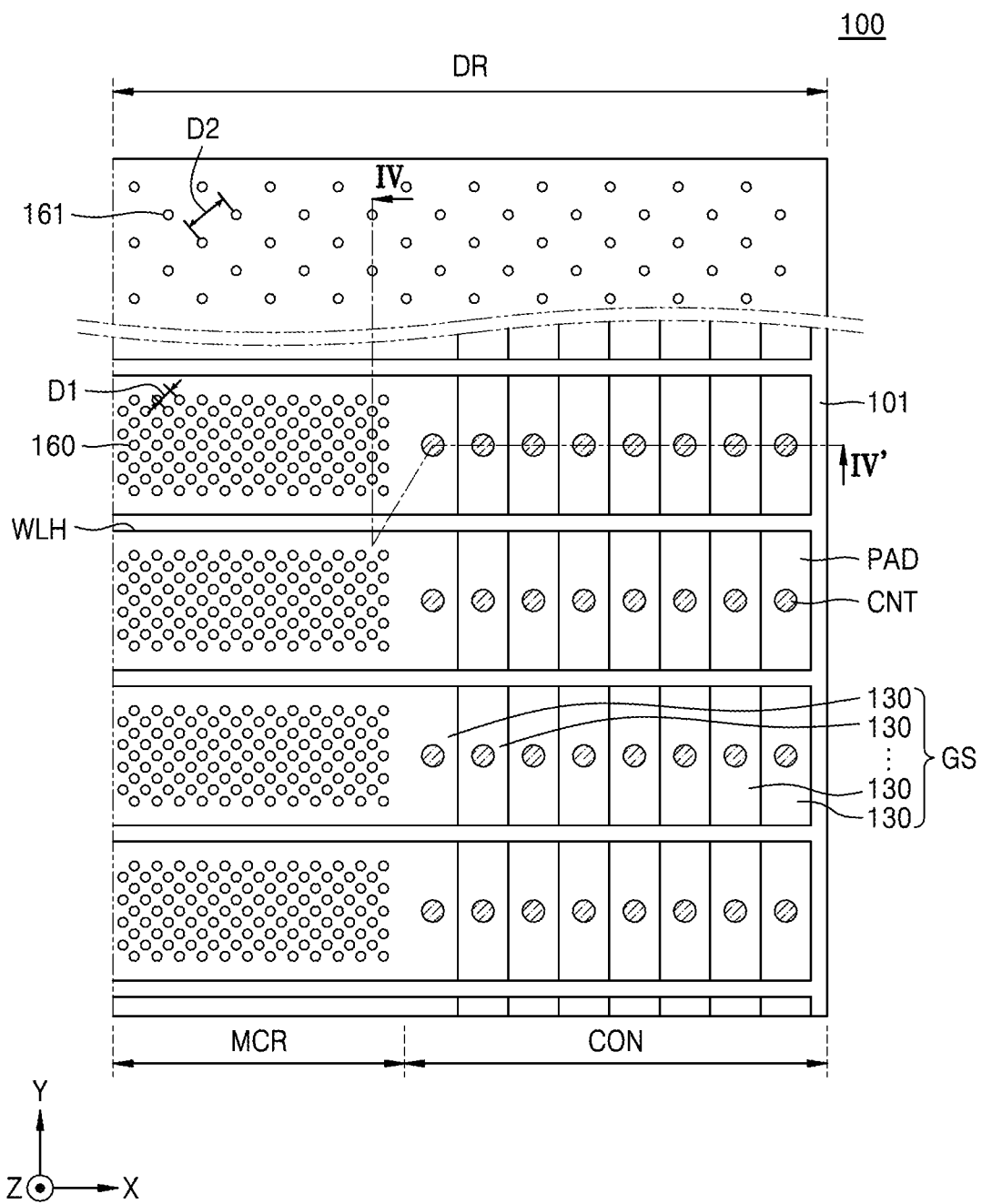
FIG. 3 is a plan view illustrating components of an integrated circuit device according to some embodiments of the inventive concept.
Figure 4:
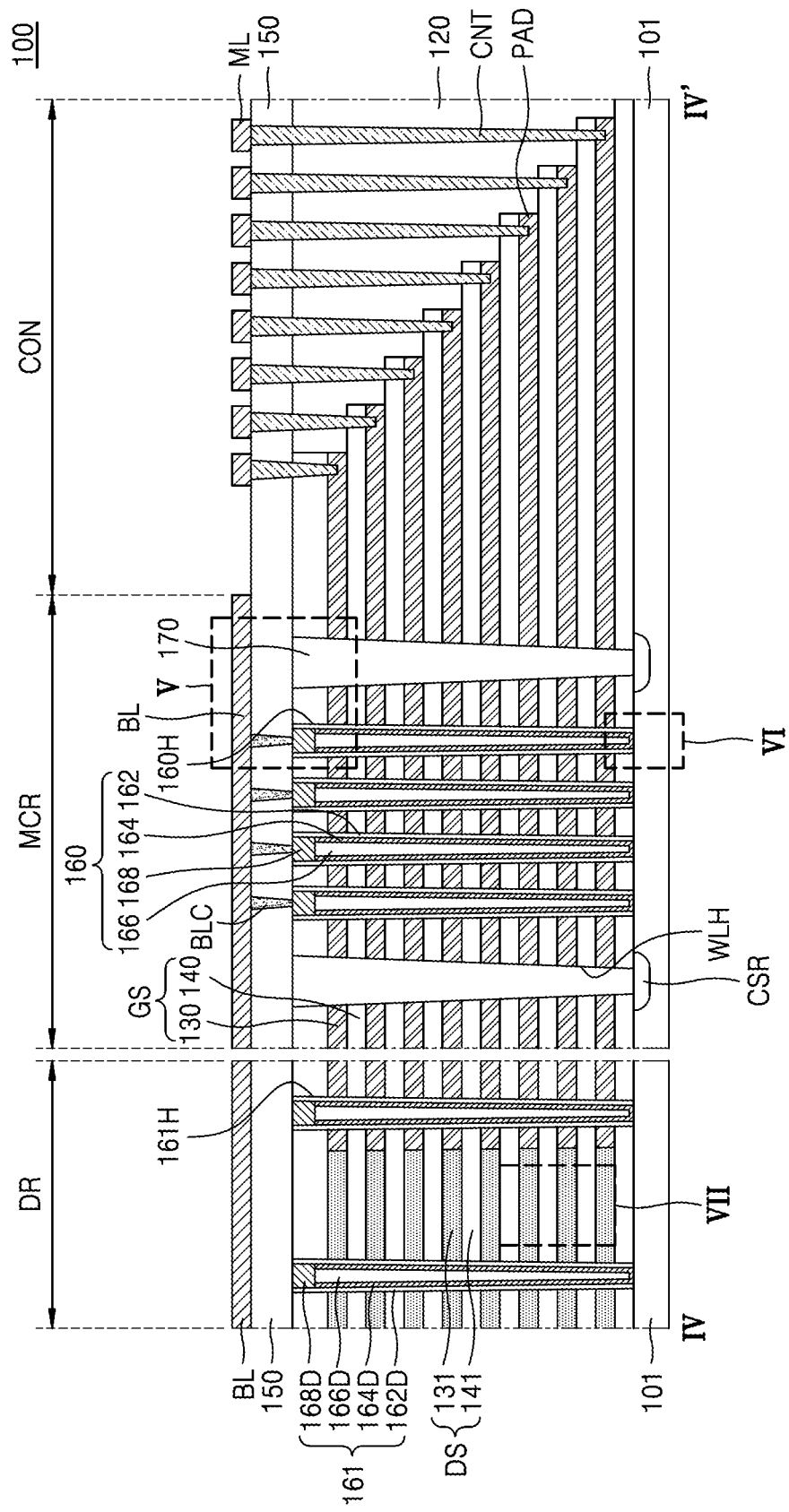
FIG. 4 is a cross-sectional view taken along line IV-IV' of FIG. 3.
Figure 5:
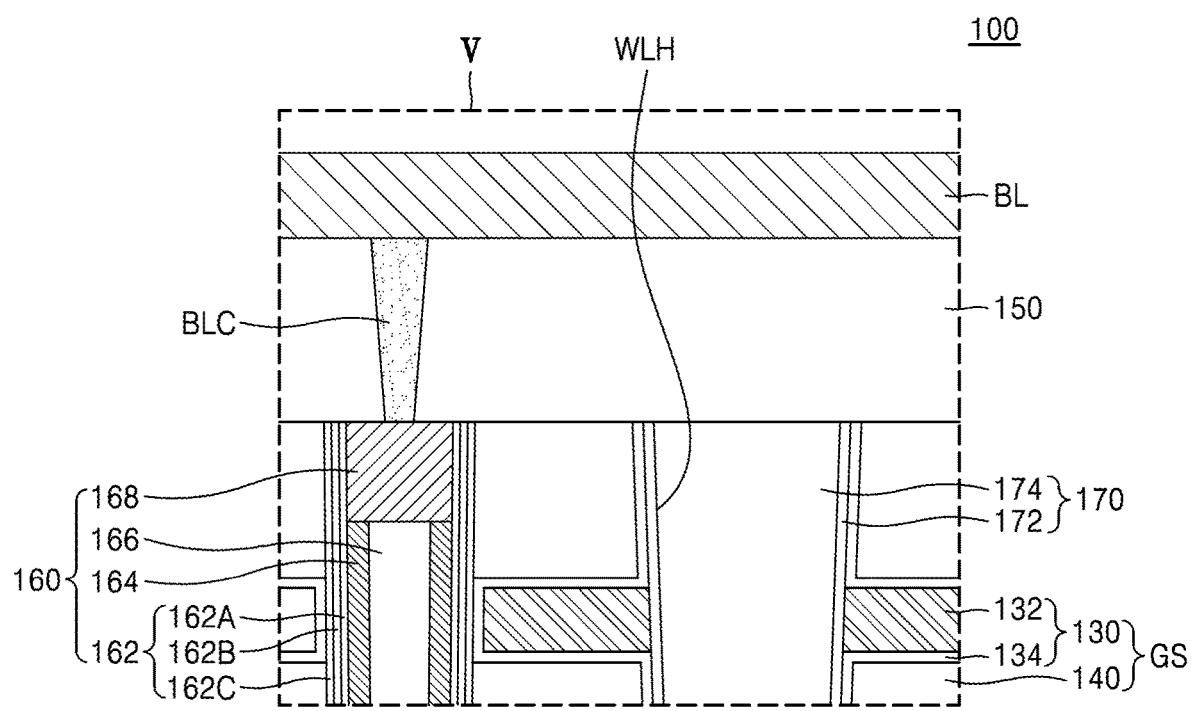
FIG. 5 is an enlarged view of a region V of FIG. 4.
Figure 6:
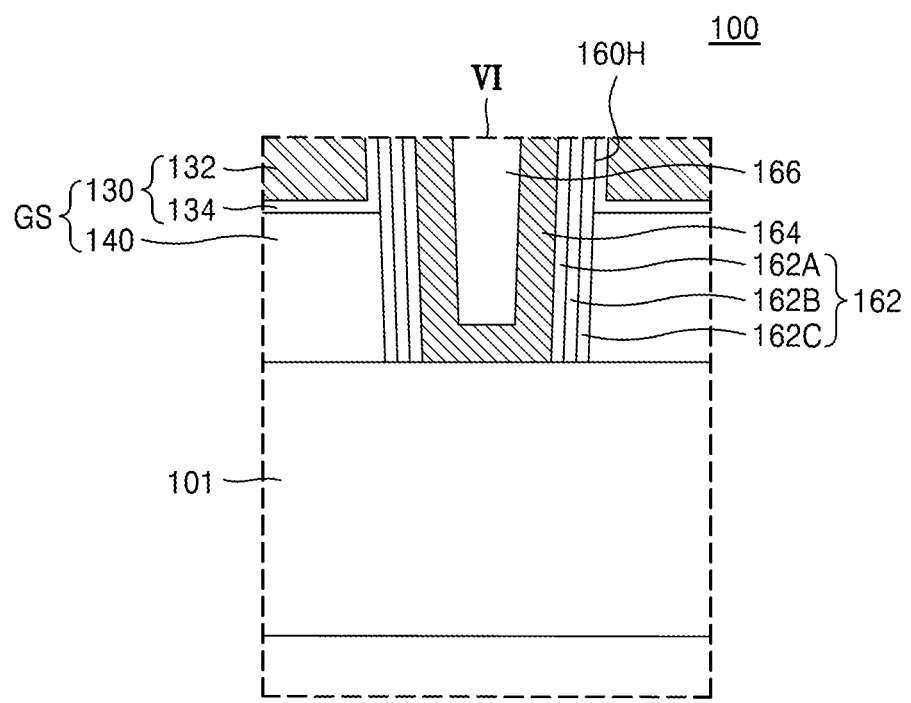
FIG. 6 is an enlarged view of a region VI of FIG. 4.
Figure 7:
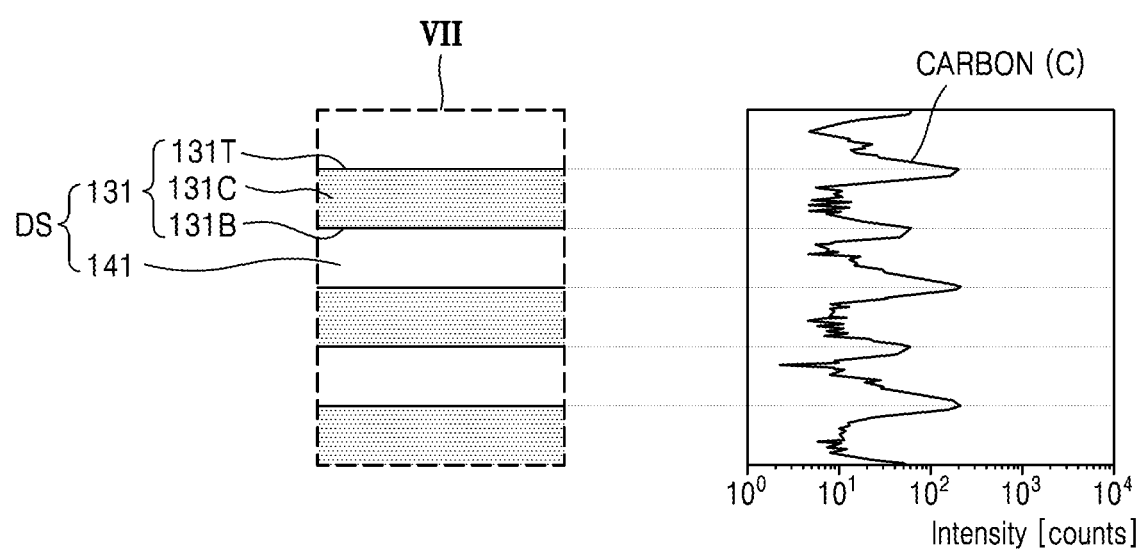
FIG. 7 is an enlarged view of a region VII of FIG. 4.

FIG. 3 is a plan view illustrating components of an integrated circuit device 100 according to some embodiments of the inventive concept, FIG. 4 is a cross-sectional view taken along line IV-IV' of FIG. 3, FIG. 5 is an enlarged view of a region V of FIG. 4, FIG. 6 is an enlarged view of a region VI of FIG. 4, and FIG. 7 is an enlarged view of a region VII of FIG. 4.

Referring to FIGS. 3 to 7, the integrated circuit device 100 may include a memory cell region MCR, a connection region CON, and a dummy region DR.

The memory cell region MCR may be an area in which the memory cell array MCA of a vertical channel structure NAND-type described with reference to FIG. 2 is formed. The connection region CON may be an area in which a pad portion PAD for electrical connection between the memory cell array MCA formed in the memory cell region MCR and a peripheral circuit area (not shown) is formed. The dummy region DR may be located outside the memory cell array MCA and the connection region CON, and may be an area in which a dummy structure, such as a test pattern is formed.

A semiconductor substrate 101 may include a semiconductor material, for example, a group IV semiconductor, a group III-V compound semiconductor, or a group II-VI oxide semiconductor. For example, the group IV semiconductor may include silicon (Si), germanium (Ge), or silicon-germanium. The semiconductor substrate 101 may be provided as a bulk wafer or a wafer on which an epitaxial layer is formed. In other embodiments, the semiconductor substrate 101 may include a silicon on insulator (SOI) substrate or a germanium on insulator (GeOI) substrate.

A gate stack GS may extend on the semiconductor substrate 101 in a first direction (X direction) and a second direction (Y direction), which are parallel to the main surface of the semiconductor substrate 101, which may be an upper surface of the semiconductor substrate 101 in the cross-sectional view of FIG. 4. The gate stack GS may include a plurality of gate electrodes 130 and a plurality of insulating layers 140, and the plurality of gate electrodes 130 and the plurality of insulating layers 140 may be alternately arranged in a third direction (Z direction) perpendicular to the upper surface of the semiconductor substrate 101. In addition, an upper insulating layer 150 may be arranged in the uppermost portion of the gate stack GS1.

Each of the gate electrodes 130 may include a buried conductive layer 132 and an insulating liner 134 surrounding or bordering the upper surface, bottom surface, and side surfaces of the buried conductive layer 132. For example, the buried conductive layer 132 may include a metal, such as tungsten, a metal silicide such as tungsten silicide, doped polysilicon, or a combination thereof. In some embodiments, the insulating liner 134 may include a high-k material, such as aluminum oxide.

The plurality of gate electrodes 130 may correspond to a ground selection line GSL, a word line WL, and at least one string selection line SSL, which constitute the memory cell string MS described above with reference to FIG. 2. For example, the lowermost one of the plurality of gate electrodes 130 may function as the ground selection line GSL, the uppermost one of the plurality of gate electrodes 230 may function as the string selection line SSL, and the remaining gate electrodes 130 may function as word lines WL. Accordingly, a memory cell string MS in which the ground selection transistor GST, the string selection transistor SST, and the memory cell transistors MC1, MC2, . . . , MCn−1, and MCn are connected in series may be provided.

In some embodiments, carbon (C) and/or hydrogen (H) may be present as impurities at a certain concentration at an interface between the gate electrode 130 and the insulating layer 140. These impurities may be caused by a residue of a material constituting the mold layer 130M (see FIG. 13B), in a replacement process of forming the gate electrode 130 by replacing the mold layer 130M with an electrode layer, during a process of manufacturing the integrated circuit device 100.

On the semiconductor substrate 101, a plurality of word line cuts 170 may extend in the first direction (X direction). A gate stack GS arranged between a pair of word line cuts 170 may constitute one block, and the pair of word line cuts 170 may define a width of the gate stack GS in the second direction (Y direction). Each of the word line cuts 170 may include an insulating spacer 172 and an insulating separation layer 174. That is, the word line cuts 170 may include an insulating structure. A plurality of common source regions CSR may be formed on the semiconductor substrate 101. The plurality of common source regions CSR may be impurity regions doped with a high concentration of impurities.

A plurality of channel structures 160 may extend in the third direction (Z direction) through the gate stack GS from the upper surface of the semiconductor substrate 101 in a memory cell region MCR. The plurality of channel structures 160 may be arranged to be spaced apart from each other at certain intervals in the first direction (X direction) and the second direction (Y direction). The plurality of channel structures 160 may be arranged in a zigzag shape or a staggered shape although embodiments of the inventive concept are not limited thereto. In some embodiments, a distance between the plurality of channel structures 160, which are adjacent to one another, may be a first distance D1.

Each of the plurality of channel structures 160 may be formed to extend inside a channel hole 160H passing through the gate stack GS. Each of the plurality of channel structures 160 may include a gate insulating layer 162, a channel layer 164, a buried insulating layer 166, and a conductive plug 168. The gate insulating layer 162 and the channel layer 164 may be sequentially arranged on the sidewall of the channel hole 160H. For example, the gate insulating layer 162 may be conformally arranged on the sidewall of the channel hole 160H, and the channel layer 164 may be conformally arranged on the sidewall and bottom of the channel hole 160H. The buried insulating layer 166 may be arranged on the channel layer 164 to at least partially fill the remaining space of the channel hole 160H. The conductive plug 168 may be arranged at the upper side of the channel hole 160H to physically contact the channel layer 164 and block the inlet (e.g., the uppermost end) of the channel hole 160H. In other embodiments, the buried insulating layer 166 may be omitted, and the channel layer 164 may have a pillar shape at least partially filling the remaining portion of the channel hole 160H.

The plurality of channel structures 160 may physically contact the semiconductor substrate 101. In some embodiments, the channel layer 164 may be arranged at the bottom of the channel hole 160H1 to physically contact the upper surface of the semiconductor substrate 101. In other embodiments, a contact semiconductor layer (not shown) having a certain height may be formed on the semiconductor substrate 101 at the bottom of the channel hole 160H, and the channel layer 164 may be electrically connected to the semiconductor substrate 101 through the contact semiconductor layer.

The gate insulating layer 162 may have a structure including a tunneling dielectric layer 162A, a charge storage layer 162B, and a blocking dielectric layer 162C sequentially on an outer wall of the channel layer 164. The relative thicknesses of the tunneling dielectric layer 162A, the charge storage layer 162B, and the blocking dielectric layer 162C constituting the gate insulating layer 162 are not limited to those illustrated in the drawings and may be variously modified.

The tunneling dielectric layer 162A may include silicon oxide, hafnium oxide, aluminum oxide, zirconium oxide, tantalum oxide, and/or the like. The charge storage layer 162B is a region in which electrons passing through the tunneling dielectric layer 162A from the channel layer 164 may be stored, and may include silicon nitride, boron nitride, silicon boron nitride, or polysilicon doped with impurities. The blocking dielectric layer 162C may include silicon oxide, silicon nitride, and/or a metal oxide having a higher dielectric constant than silicon oxide.

In one block, the uppermost one of the gate electrodes 130 may be divided into two portions in a plan view by a string separation-insulating layer (not shown). The two portions may constitute the string selection line SSL described above with reference to FIG. 2.

In the connection region CON, the gate electrode 130 may extend to form a pad portion PAD at an end of the gate electrode 130, and a cover insulating layer 120 may be on and at least partially cover the pad portion PAD. In the connection region CON, the lengths of the plurality of gate electrodes 130 may decrease in the first direction (X direction) away from the upper surface of the semiconductor substrate 101 in the third direction (Z direction). That is, in the connection region CON, the plurality of gate electrodes 130 may have stepped structures.

A contact plug CNT, which passes through the cover insulating layer 120 and is connected to the pad portion PAD of the gate electrode 130, may be arranged in the connection area CON. The contact plug CNT may have a tapered column shape that narrows in width in the third direction (Z direction) from an upper region to a lower region thereof.

The bit line contact BLC may pass through the upper insulating layer 150 to physically contact the conductive plug 168 of the channel structure 160, and on the upper insulating layer 150, a bit line BL physically contacting the bit line contact BLC may extend in the second direction (Y direction). In addition, a conductive line ML may be formed on the upper insulating layer 150 in the connection region CON. Although not shown in the drawings, an upper support layer may be further formed between the upper insulating layer 150 and the bit line BL, and between the upper insulating layer 150 and the conductive line ML.

A dummy stack DS may extend in the first direction (X direction) and the second direction (Y direction), which are parallel to the main surface of the semiconductor substrate 101, on the dummy region DR of the semiconductor substrate 101. The dummy stack DS may include a plurality of dummy mold layers 131 and a plurality of dummy insulating layers 141, and the plurality of dummy mold layers 131 and the plurality of dummy insulating layers 141 may be alternately arranged in the third direction (Z direction) perpendicular to the upper surface of the semiconductor substrate 101. In addition, the upper insulating layer 150 may be arranged in the uppermost portion of the dummy stack DS.

A plurality of dummy structures 161 may extend in the third direction (Z direction) through the dummy stack DS from the upper surface of the semiconductor substrate 101 in the dummy region DR. The plurality of dummy structures 161 may be arranged to be apart from each other at certain intervals in the first direction (X direction) and the second direction (Y direction). The plurality of dummy structures 161 may be arranged in a zigzag shape or a staggered shape, but embodiments of the inventive concept are not limited thereto. In some embodiments, a distance between the plurality of dummy structures 161, which are adjacent to one another, may be a second distance D2.

The plurality of dummy mold layers 131 may be arranged at the same level as the plurality of gate electrodes 130 in the third direction (Z direction), and the plurality of dummy insulating layers 141 may be arranged at the same level as the plurality of insulating layers 140 in the third direction (Z direction). The plurality of dummy insulating layers 141 may include the same material as the plurality of insulating layers 140. This may be due to a replacement process of forming the gate electrode 130 by replacing the mold layer 130M (see FIG. 13B) with an electrode layer according to a process of manufacturing the integrated circuit device 100.

In some embodiments, the carbon (C) concentration of a dummy mold layer 131 as an upper layer of the plurality of dummy mold layers 131 (i.e., an upper dummy mold layer) may be less than the carbon (C) concentration of a dummy mold layer 131 as a lower layer of the plurality of dummy mold layers 131 (i.e., a lower dummy mold layer). This feature may be due to a process of removing impurities such as carbon (C) by performing an annealing process using ultraviolet rays on the dummy mold layer 131 located as the upper layer, according to the process of manufacturing the integrated circuit device 100. For example, in the cross-sectional view of FIG. 4, the carbon (C) concentration of the dummy mold layer 131 located as the upper layer may be about 0% to about 80% of the carbon (C) concentration of the dummy mold layer 131 located as the lower layer. In other embodiments, impurities such as carbon (C) may be removed by performing a plasma process using oxygen ($O_2$) on the dummy mold layer 131 located as the upper layer.

In some embodiments, the carbon C in the dummy region DR may have a concentration distribution similar to a sine wave in the third direction (Z direction) from the main surface of the semiconductor substrate 101, see, e.g., FIG. 7. In other words, in one dummy mold layer 131 of the plurality of dummy mold layers 131, the carbon (C) concentration of each of an upper interface 131T and a lower interface 131B may be greater than the carbon (C) concentration of a central portion 131C. For example, the carbon (C) concentration of the upper interface 131T may be about 5 times or more the carbon (C) concentration of the central portion 131C. In addition, the carbon (C) concentration of the upper interface 131T may be greater than the carbon (C) concentration of the lower interface 131B, where the lower interface 131B is between the upper interface 131T and the main surface of the substrate 101.

In some embodiments, each of the plurality of gate electrodes 130 may include a first conductive material such as tungsten, and at least a portion of the sidewall of each of the plurality of dummy mold layers 131 may contact the first conductive material. That is, the plurality of dummy mold layers 131 may correspond to a region in which a portion of the mold layer 130M (see FIG. 13B) remains, and may be arranged to come into physical contact with portions of the plurality of gate electrodes 130 formed in a region from which the mold layer 130M (see FIG. 13B) has been removed.

The plurality of dummy structures 161 may be formed to extend inside a dummy hole 161H passing through the dummy stack DS. Each of the plurality of dummy structures 161 may include a dummy gate insulating layer 162D, a dummy channel layer 164D, a dummy buried insulating layer 166D, and a dummy conductive plug 168D.

Here, the first distance D1 between the plurality of channel structures 160, which are adjacent to one another, may be less than the second distance D2 between the plurality of dummy structures 161, which are adjacent to one another. Because the plurality of dummy structures 161 do not function as memory cells in the integrated circuit device 100, the plurality of dummy structures 161 may be arranged at intervals of the second distance D2 by which the plurality of dummy structures 161 are sufficiently apart from each other. Accordingly, because an etchant used in the replacement process may not completely remove the mold layer 130M (see FIG. 13B) located in the dummy region DR, a portion of the mold layer 130M may remain as the dummy mold layer 131 on the sidewalls of some dummy structures 161.

With the development of process technology, as the height of the gate stack GS increases, the aspect ratio of the channel structure 160, that is, the ratio of the height to the width of the channel structure 160, may increase. In particular, in a structure in which the gate stack GS includes a plurality of gate electrodes 130, the aspect ratio of the channel structure 160 may be further increased. In addition, the channel hole 160H may have a tapered column shape that narrows in width in the third direction (Z direction) from an upper region to a lower region thereof as shown in the cross-sectional view of FIG. 4. Accordingly, the first distance D1 between the plurality of channel structures 160, which are adjacent to one another, may be within an error range of a process margin.

In this case, during a process of manufacturing a general integrated circuit device, and more particularly, during an etching process of forming a channel hole, due to carbon (C) and/or hydrogen (H) impurities present at an interface between a mold layer and an insulating layer, more ion energy may be transferred to a mold layer located as an upper layer and fluorine (F) radicals may penetrate through an upper interface of the mold layer located as the upper layer, thereby causing over-etching. Subsequently, when a channel structure is formed in a channel hole in which over-etching has occurred, a defect in which adjacent channel structures come into contact with each other may occur.

To address this problem, in the integrated circuit device 100 according to some embodiments of the inventive concept, carbon (C) and/or hydrogen (H) impurities present at the interface between the mold layer 130M (see FIG. 13B) and the insulating layer 140 may be efficiently removed by performing a low-temperature annealing process using ultraviolet rays on the mold layer 130M located as the upper layer. Accordingly, by suppressing the occurrence of over-etching at the interface of the mold layer 130M located as the upper layer, the occurrence of a defect in which adjacent channel structures 160 come into physical contact with each other may be significantly reduced.

An analysis of a change in carbon (C) concentration according to the temperature of an annealing process using ultraviolet rays has been performed. Accordingly, an application of a low-temperature annealing process performed below about 400° C. has been devised, which may reduce the concentration of impurities present at the interface between the mold layer 130M and the insulating layer 140 and may not affect other material layers.

Consequently, the integrated circuit device 100 according to some embodiments of the inventive concept may be manufactured by performing a low-temperature annealing process using ultraviolet rays on an upper mold layer, that is, the mold layer 130M located as the upper layer, in a vertical memory device, and thus, over-etching defects that may occur due to impurities in a process of forming the channel hole 160H may be effectively suppressed. Accordingly, the occurrence of a defect in which adjacent channel structures 160 come into physical contact with each other may be significantly reduced, thereby improving product reliability.

Figure 8:
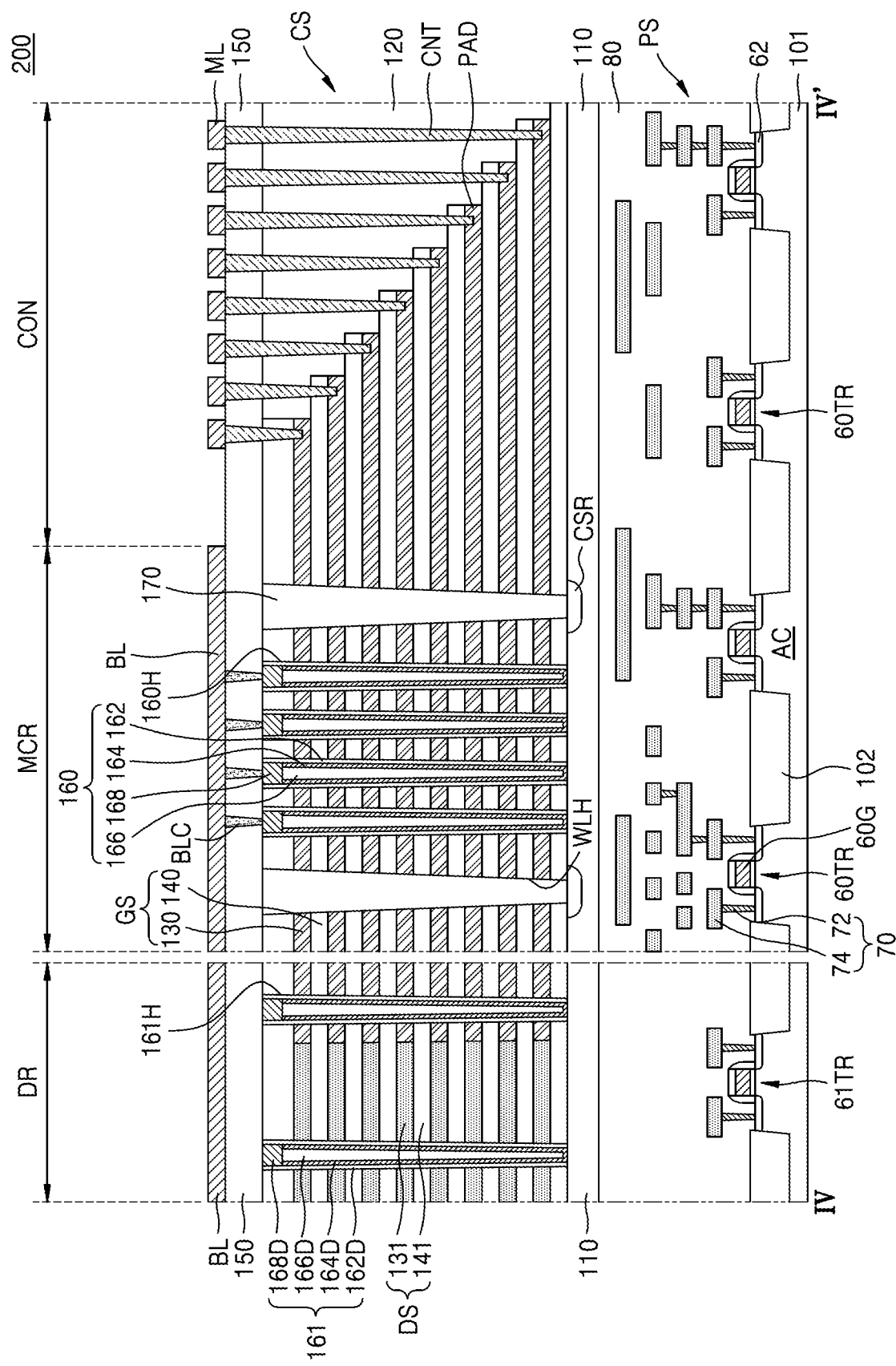
FIGS. 8 to 10 are cross-sectional views of integrated circuit devices according to other embodiments of the inventive concept, respectively.
Figure 9:
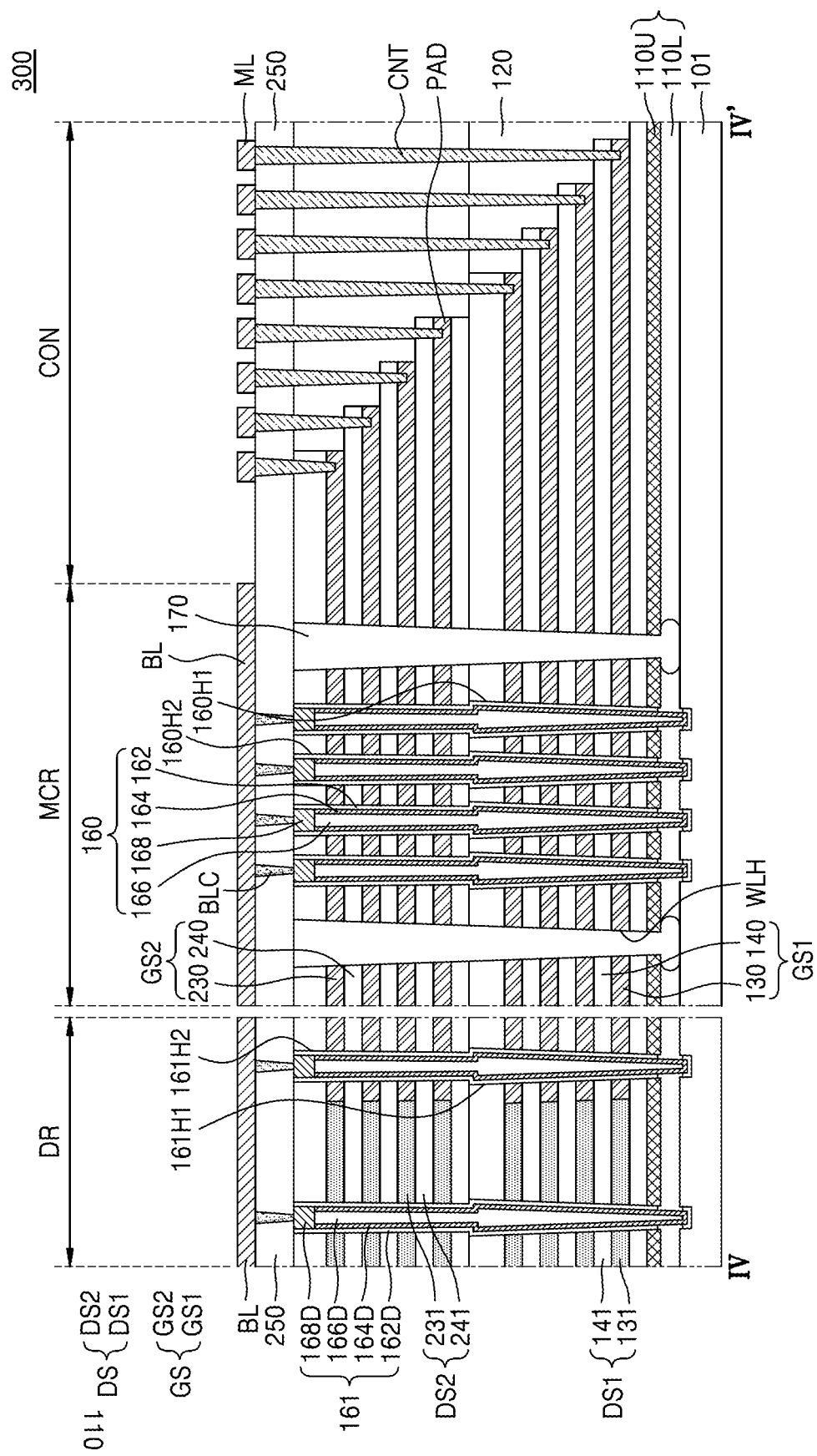
Figure 10:
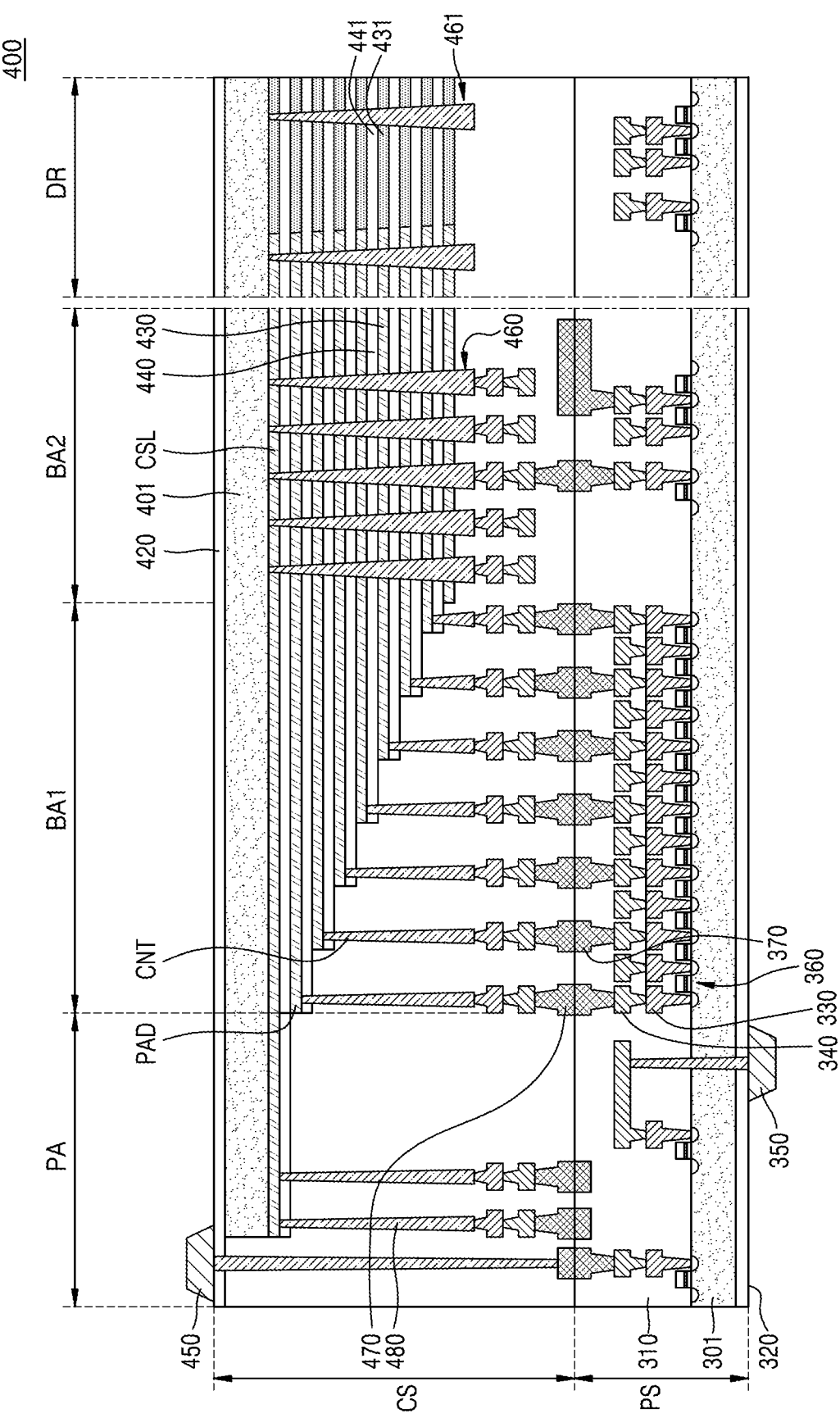

FIGS. 8 to 10 are cross-sectional views of integrated circuit devices 200, 300, and 400 according to other embodiments of the inventive concept, respectively.

Most of the constituent elements constituting the integrated circuit devices 200, 300, and 400 described below and materials constituting the constituent elements are substantially the same as or similar to those described above with reference to FIGS. 3 to 7. Therefore, for convenience of description, descriptions of the embodiments will be made focusing on the differences from the integrated circuit device 100 described above.

Referring to FIG. 8, the integrated circuit device 200 may include a peripheral circuit structure PS and a cell array structure CS arranged at a higher vertical level than the peripheral circuit structure PS.

The integrated circuit device 200 according to the embodiment may have a cell on periphery (COP) structure in which the cell array structure CS is arranged on the peripheral circuit structure PS. A base structure 110 may be arranged between the peripheral circuit structure PS and the cell array structure CS.

The peripheral circuit structure PS may include a peripheral circuit transistor 60TR and a peripheral circuit wiring 70, which are arranged on a semiconductor substrate 101. In the semiconductor substrate 101, an active region AC may be defined by a device isolation layer 102, and a plurality of peripheral circuit transistors 60TR may be formed on the active region AC. The plurality of peripheral circuit transistors 60TR may each include a peripheral circuit gate 60G and source/drain regions 62 arranged in a portion of the semiconductor substrate 101 on both sides of the peripheral circuit gate 60G.

The peripheral circuit wiring 70 may include a plurality of peripheral circuit contacts 72 and a plurality of peripheral circuit metal layers 74. An interlayer insulating layer 80 on and at least partially covering the peripheral circuit transistor 60TR and the peripheral circuit wiring 70 may be arranged on the semiconductor substrate 101. The plurality of peripheral circuit metal layers 74 may have a multilayer structure including a plurality of metal layers arranged at different vertical levels. In the drawing, it is shown that the plurality of peripheral circuit metal layers 74 have the same height. However, in other embodiments, peripheral circuit metal layers 74 arranged at some levels (e.g., arranged at the top level) may be formed to have a higher height than peripheral circuit metal layers 74 arranged at the other levels.

In the present embodiment, the peripheral circuit structure PS may include a dummy transistor 61TR arranged in a dummy region DR on the semiconductor substrate 101. The dummy region DR may be located outside a memory cell array MCA and a connection region CON, and may be a region in which a dummy structure such as the dummy transistor 61TR is formed.

Referring to FIG. 9, the integrated circuit device 300 may include a lower first gate stack GS1 and an upper second gate stack GS2.

In the integrated circuit device 300 of the present embodiment, the first gate stack GS1 may include a plurality of first gate electrodes 130 and a plurality of first insulating layers 140, and the plurality of first gate electrodes 130 and the plurality of first insulating layers 140 may be alternately arranged in the third direction (Z direction) perpendicular to the upper surface of the base structure 110. In addition, a first upper insulating layer 150 may be arranged in the uppermost portion of the first gate stack GS1.

The second gate stack GS2 may include a plurality of second gate electrodes 230 and a plurality of second insulating layers 240, and the plurality of second gate electrodes 230 and the plurality of second insulating layers 240 may be alternately arranged on the first gate stack GS1 in the third direction (Z direction). In addition, a second upper insulating layer 250 may be arranged in the uppermost portion of the second gate stack GS2.

A plurality of channel structures 160 may be formed to extend inside a first channel hole 160H1 passing through the first gate stack GS1 and a second channel hole 160H2 passing through the second gate stack GS2. The plurality of channel structures 160 may have a shape protruding outward from a boundary portion between the first channel hole 160H1 and the second channel hole 160H2.

The plurality of channel structures 160 may pass through the base structure 110 including an upper base layer 110U and a lower base layer 110L and physically contact the semiconductor substrate 101. Therefore, a channel layer 164 may be electrically connected to the lower base layer 110L instead of making direct physical contact with the semiconductor substrate 101.

In the present embodiment, a plurality of dummy structures 161 formed in the dummy region DR may be formed to extend inside a first dummy hole 161H1 passing through a first dummy stack DS1 and a second dummy hole 161H2 passing through a second dummy stack DS2. The plurality of dummy structures 161 may have a shape protruding outward from a boundary portion between the first dummy hole 161H1 and the second dummy hole 161H2.

Referring to FIG. 10, the integrated circuit device 400 may have a chip to chip structure.

In the integrated circuit device 400 of the present embodiment, an upper chip including a cell array structure CS is manufactured, a lower chip including a peripheral circuit structure PS is manufactured, and then the upper chip and the lower chip are connected to each other by a bonding method.

In some embodiments, the bonding method may refer to a method in which a bonding pad formed in an uppermost portion of the upper chip and a bonding pad formed in an uppermost portion of the lower chip physically contact each other. The bonding method may be implemented using a metal-metal bonding structure, a through silicon via (TSV), a back via stack (BVS), a eutectic bonding structure, a ball grid array (BGA) bonding structure, a plurality of wiring lines, and/or a combination thereof.

The peripheral circuit structure PS may include a circuit substrate 301, an interlayer insulating layer 310, a plurality of circuit elements 360, a first metal layer 330 connected to each of the plurality of circuit elements 360, and a second metal layer 340 formed on the first metal layer 330.

The interlayer insulating layer 310 may be arranged on the circuit substrate 301 to be on and at least partially cover the plurality of circuit elements 360, the first metal layer 330, and the second metal layer 340 and may include an insulating material.

A lower bonding pad 370 may be formed on the second metal layer 340 in a word line bonding area BAL. In the word line bonding area BA1, the lower bonding pad 370 of the peripheral circuit structure PS may be electrically connected, by a bonding method, to an upper bonding pad 470 of the cell array structure CS.

The cell array structure CS may provide at least one memory block. The cell array structure CS may include a cell substrate 401 and a common source line CSL. A plurality of word lines 430 and a plurality of insulating layers 440 may be stacked on the cell substrate 401 in the third direction (Z direction).

In a bit line bonding area BA2, the channel structure 460 may pass through the word lines 430, the insulating layers 440, string selection lines, and a ground selection line in the third direction (Z direction).

In the word line bonding area BA1, the word lines 430 may extend parallel to the upper surface of the cell substrate 401 and may be connected to a plurality of contact plugs CNT. The word lines 430 and the contact plugs CNT may be connected to each other in a pad portion PAD provided by extending at least some of the word lines 430 to different lengths.

A common source line contact 480 may be arranged in an outer pad bonding area PA. The common source line contact 480 may include a conductive material, such as a metal, a metal compound, or polysilicon, and may be electrically connected to the common source line CSL.

First and second input/output pads 350 and 450 may be arranged in the outer pad bonding area PA. A lower layer 320 on and at least partially covering a lower surface of the circuit substrate 301 may be formed under the circuit substrate 301, and the first input/output pad 350 may be formed on the lower layer 320. An upper layer 420 on and at least partially covering an upper surface of the cell substrate 401 may be formed on the cell substrate 401, and the second input/output pad 450 may be arranged on the upper layer 420.

In the present embodiment, a plurality of dummy mold layers 431 and a plurality of dummy insulating layers 441 may be alternately arranged in the dummy region DR. In addition, a plurality of dummy structures 461 may be formed to pass through the plurality of dummy mold layers 431 and the plurality of dummy insulating layers 441.

Figure 11:
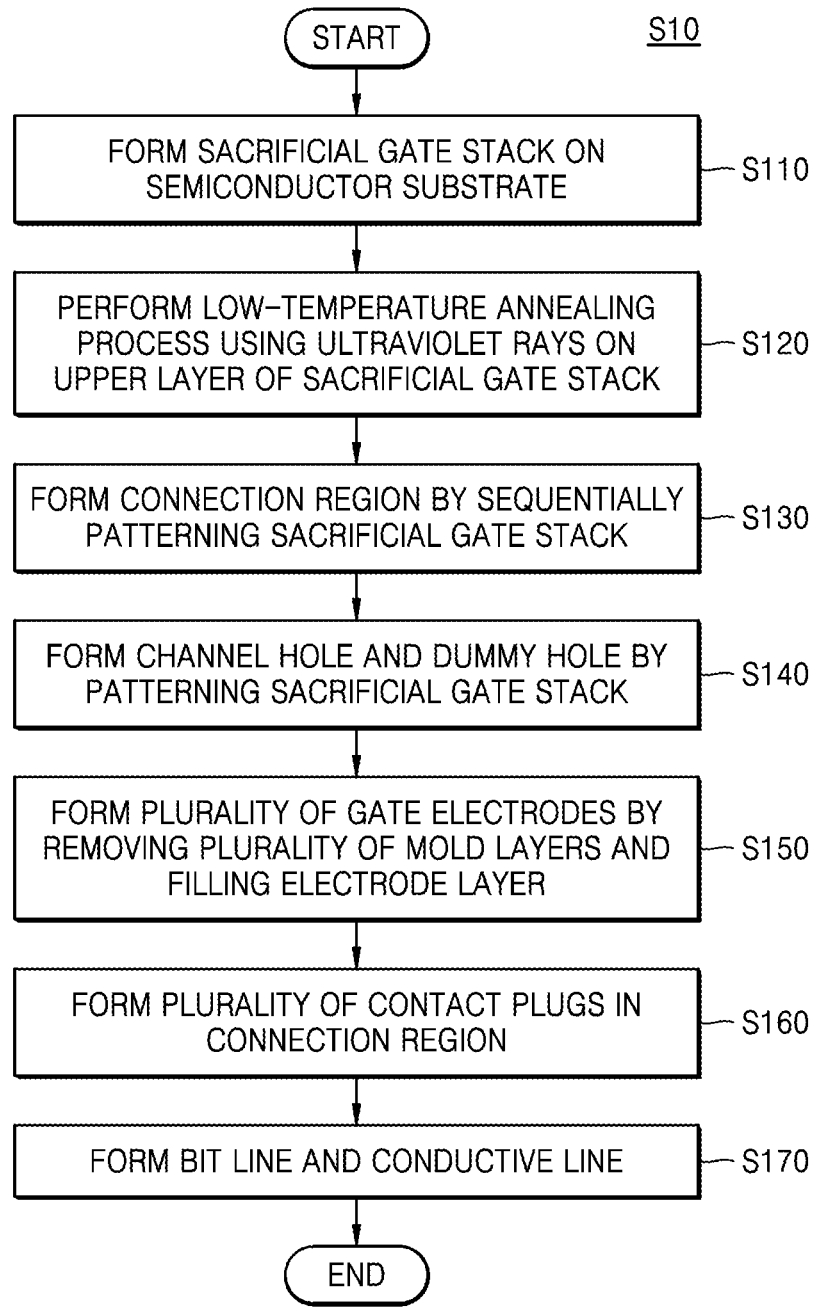
FIGS. 11 and 12 are flowcharts of a method of manufacturing an integrated circuit device, according to some embodiments of the inventive concept.
Figure 12:
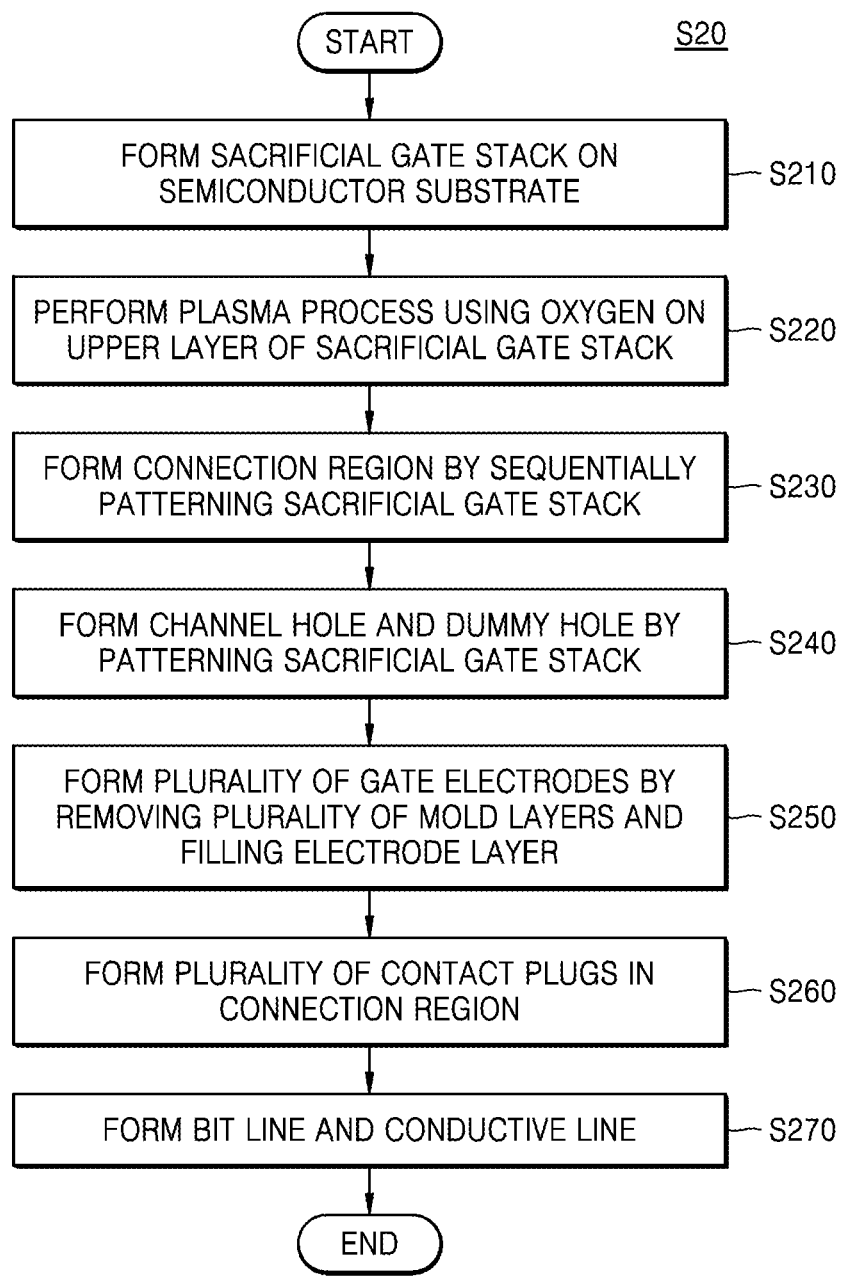

FIGS. 11 and 12 are flowcharts illustrating methods of manufacturing an integrated circuit device, according to some embodiments of the inventive concept.

Embodiments of the inventive concept may be implemented in a variety of different ways. For example, a certain process order may be performed differently from an order described below. For example, two processes described in succession may be substantially and simultaneously performed, or may be performed in an order opposite to an order described below.

Referring to FIG. 11, a method S10 of manufacturing an integrated circuit device may include a process sequence of first to seventh operations S110 to S170.

The method S10 of manufacturing an integrated circuit device may include a first operation S110 of forming a sacrificial gate stack on a semiconductor substrate, a second operation S120 of performing a low-temperature annealing process using ultraviolet rays on an upper layer of the sacrificial gate stack, a third operation S130 of forming a connection region by sequentially patterning the sacrificial gate stack, a fourth operation S140 of forming a channel hole and a dummy hole by patterning the sacrificial gate stack, a fifth operation S150 of forming a plurality of gate electrodes by removing a plurality of mold layers and at least partially filling an electrode layer, a sixth operation S160 of forming a plurality of contact plugs in the connection region, and a seventh operation S170 of forming a bit line and a conductive line.

Technical characteristics of each of the first to seventh operations S110 to S170 are described below in detail with reference to FIGS. 13A to 13E.

Referring to FIG. 12, a method S20 of manufacturing an integrated circuit device may include a process sequence of first to seventh operations S210 to S270.

The method S20 of manufacturing an integrated circuit device may include a first operation S210 of forming a sacrificial gate stack on a semiconductor substrate, a second operation S220 of performing a plasma process using oxygen on an upper layer of the sacrificial gate stack, a third operation S230 of forming a connection region by sequentially patterning the sacrificial gate stack, a fourth operation S240 of forming a channel hole and a dummy hole by patterning the sacrificial gate stack, a fifth operation S250 of forming a plurality of gate electrodes by removing a plurality of mold layers and at least partially filling an electrode layer, a sixth operation S250 of forming a plurality of contact plugs in the connection region, and a seventh operation S270 of forming a bit line and a conductive line.

FIGS. 13A to 13E are cross-sectional views illustrating, according to a process sequence, a method of manufacturing an integrated circuit device, according to some embodiments of the inventive concept.

Figure 13A:
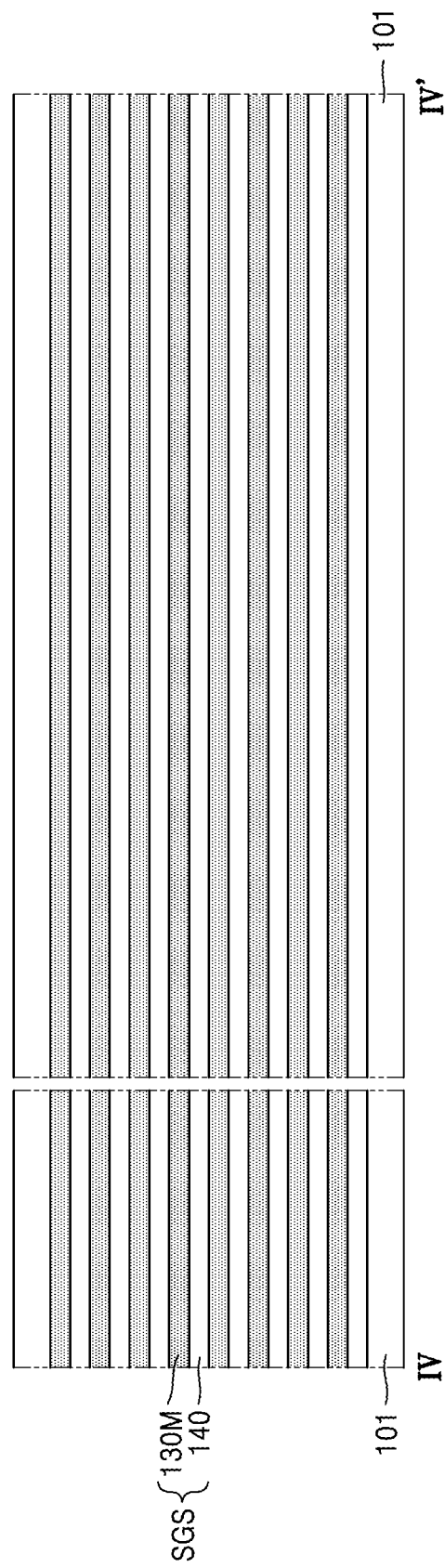
FIGS. 13A to 13E are cross-sectional views illustrating, according to a process sequence, a method of manufacturing an integrated circuit device, according to some embodiments of the inventive concept.

Referring to FIG. 13A, a sacrificial gate stack SGS may be formed on a semiconductor substrate 101.

The sacrificial gate stack SGS may be formed by alternately forming a plurality of insulating layers 140 and a plurality of mold layers 130M on the main or top surface of the semiconductor substrate 101.

In some embodiments, the plurality of insulating layers 140 may include an insulating material, such as silicon oxide and/or silicon oxynitride. The plurality of mold layers 130M may include a material that is different from that of the plurality of insulating layers 140. The plurality of mold layers 130M may include silicon nitride, silicon oxynitride, and/or polysilicon doped with impurities.

In this case, carbon (C) and/or hydrogen (H) may be present as impurities at a certain concentration at an interface between the plurality of insulating layers 140 and the plurality of mold layers 130M.

Figure 13B:
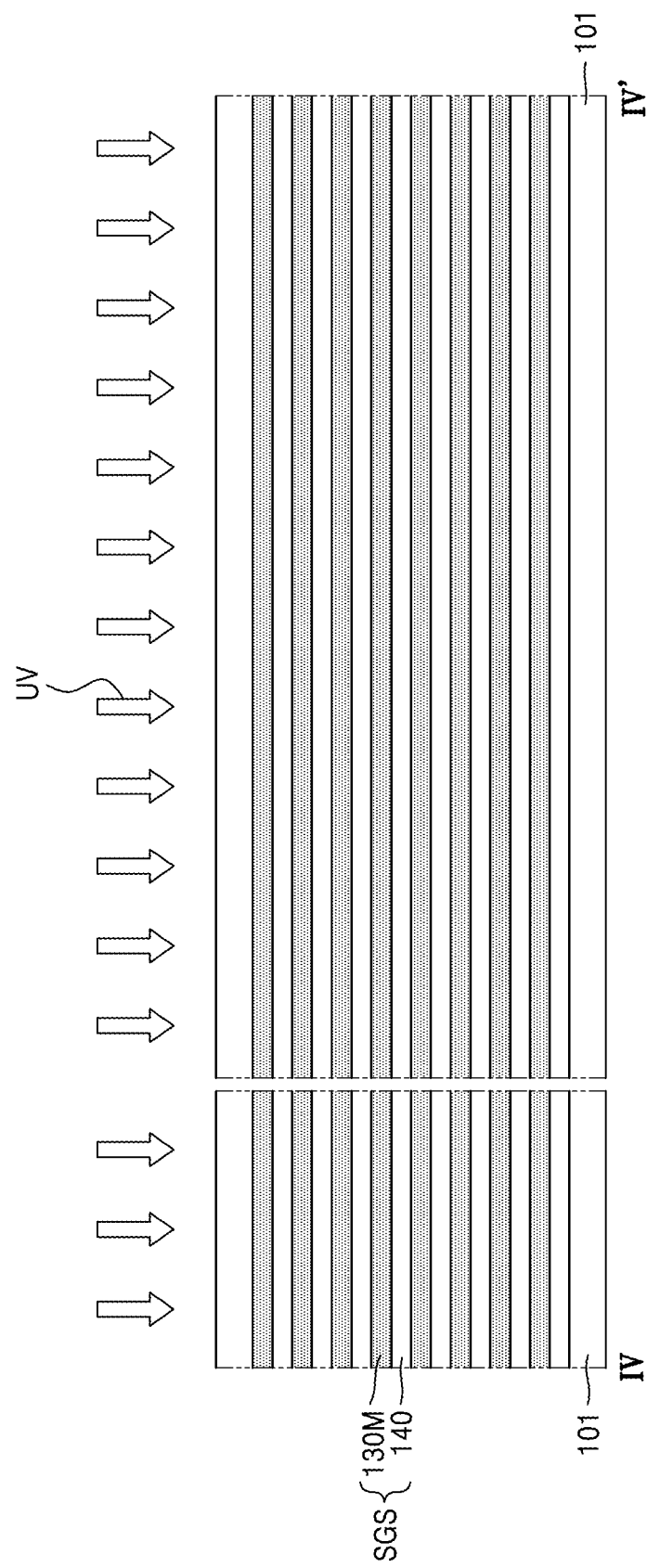

Referring to FIG. 13B, an annealing process may be performed, such that the impurity concentration of a mold layer 130M located as an upper layer of the plurality of mold layers 130M is less than the impurity concentration of a mold layer 130M located as a lower layer of the plurality of mold layers 130M.

In a process of manufacturing the integrated circuit device 100, according to the embodiment of the inventive concept, by performing a low-temperature annealing process using ultraviolet rays UV on a mold layer 130M at a certain location, for example, the mold layer 130M located as the upper layer, impurities present at the interface between the plurality of insulating layers 140 and the plurality of mold layers 130M may be removed or reduced. For example, an annealing process may be performed, such that the carbon (C) concentration of the mold layer 130M located as the upper layer is about 0% to about 80% of the carbon (C) concentration of the mold layer 130M located as the lower layer.

In addition, to break a bonding combination of impurities, such as carbon (C) and/or hydrogen (H) from the mold layer 130M to outgas the impurities in the form of a gas, a low-temperature annealing process using ultraviolet rays (UV) may be performed before forming the insulating layer 140 after forming the mold layer 130M in an upper layer of the sacrificial gate stack SGS.

Figure 13C:
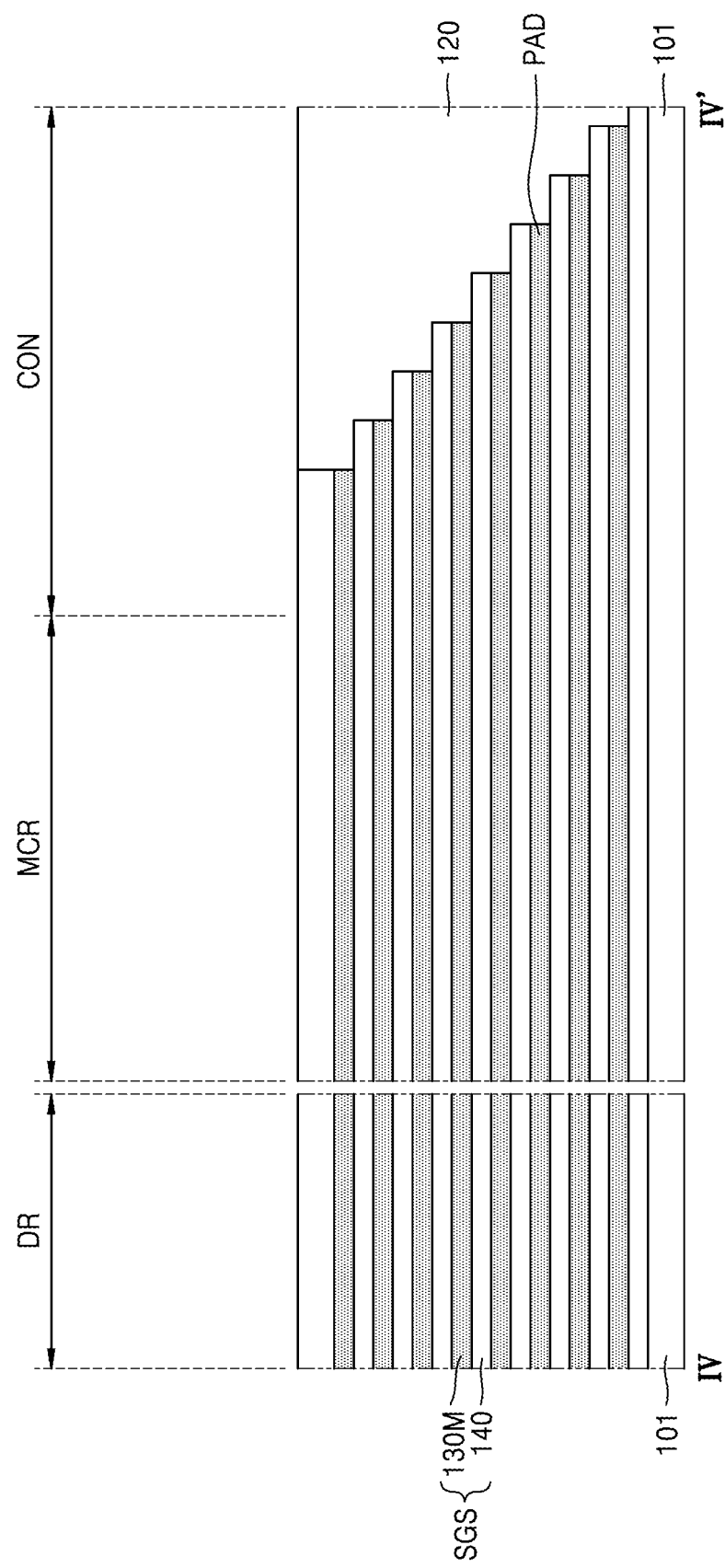

Referring to FIG. 13C, a pad portion PAD may be formed by sequentially patterning the sacrificial gate stack SGS in a connection region CON.

The sacrificial gate stack SGS may include a memory cell region MCR and a connection region CON, and may include a pad portion PAD at an end of the mold layer 130M in the connection region CON.

Subsequently, a cover insulating layer 120 may be formed to be on and at least partially cover the pad portion PAD. The cover insulating layer 120 may include an insulating material, such as silicon oxide, silicon nitride, and/or silicon oxynitride.

Figure 13D:
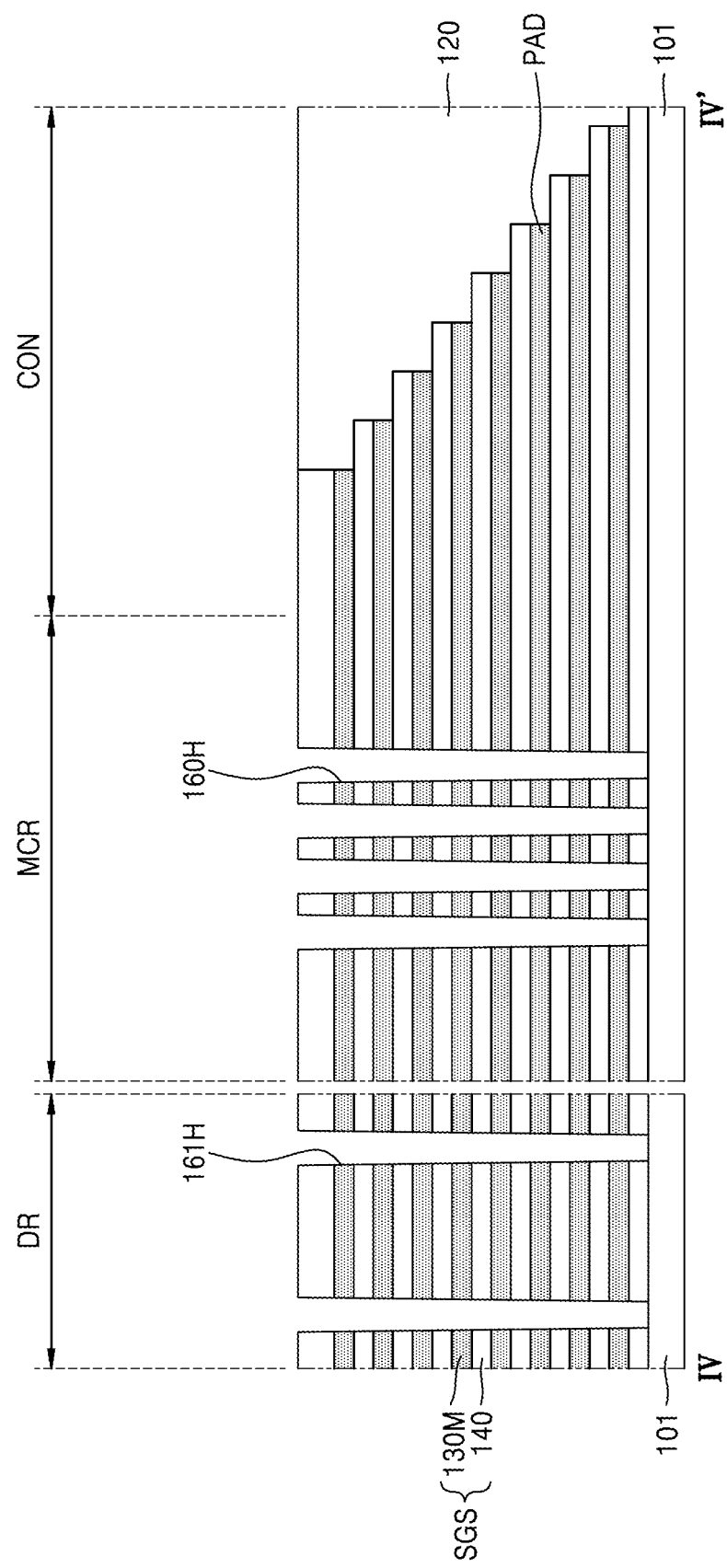

Referring to FIG. 13D, a channel hole 160H and a dummy hole 161H may be formed by patterning the sacrificial gate stack SGS.

In the sacrificial gate stack SGS, the channel hole 160H may be formed by removing a portion of the memory cell region MCR, and the dummy hole 161H may be formed by removing a portion of the dummy region DR.

With the development of process technology, as the height of the sacrificial gate stack SGS increases, the aspect ratio of the channel hole 160H may increase, and an interval between adjacent channel holes 160H may be within an error range of a process margin.

In this case, in a process of etching the channel hole 160H during a process of manufacturing a general integrated circuit device, due to carbon (C) and/or hydrogen (H) impurities present at the interface between the mold layer 130M and the insulating layer 140, more ion energy may be transferred to the mold layer 130M located as the upper layer. Accordingly, fluorine (F) radicals may penetrate through an upper interface of the mold layer 130M located as the upper layer, thereby causing over-etching.

Therefore, in the process of manufacturing an integrated circuit device according to the embodiment of the inventive concept, a low-temperature annealing process using ultraviolet rays may be performed on the mold layer 130M located as the upper layer, and thus, the occurrence of over-etching at the interface of the mold layer 130M located as the upper layer may be suppressed and over-etching defects of the channel hole 160H may be significantly reduced.

Figure 13E:
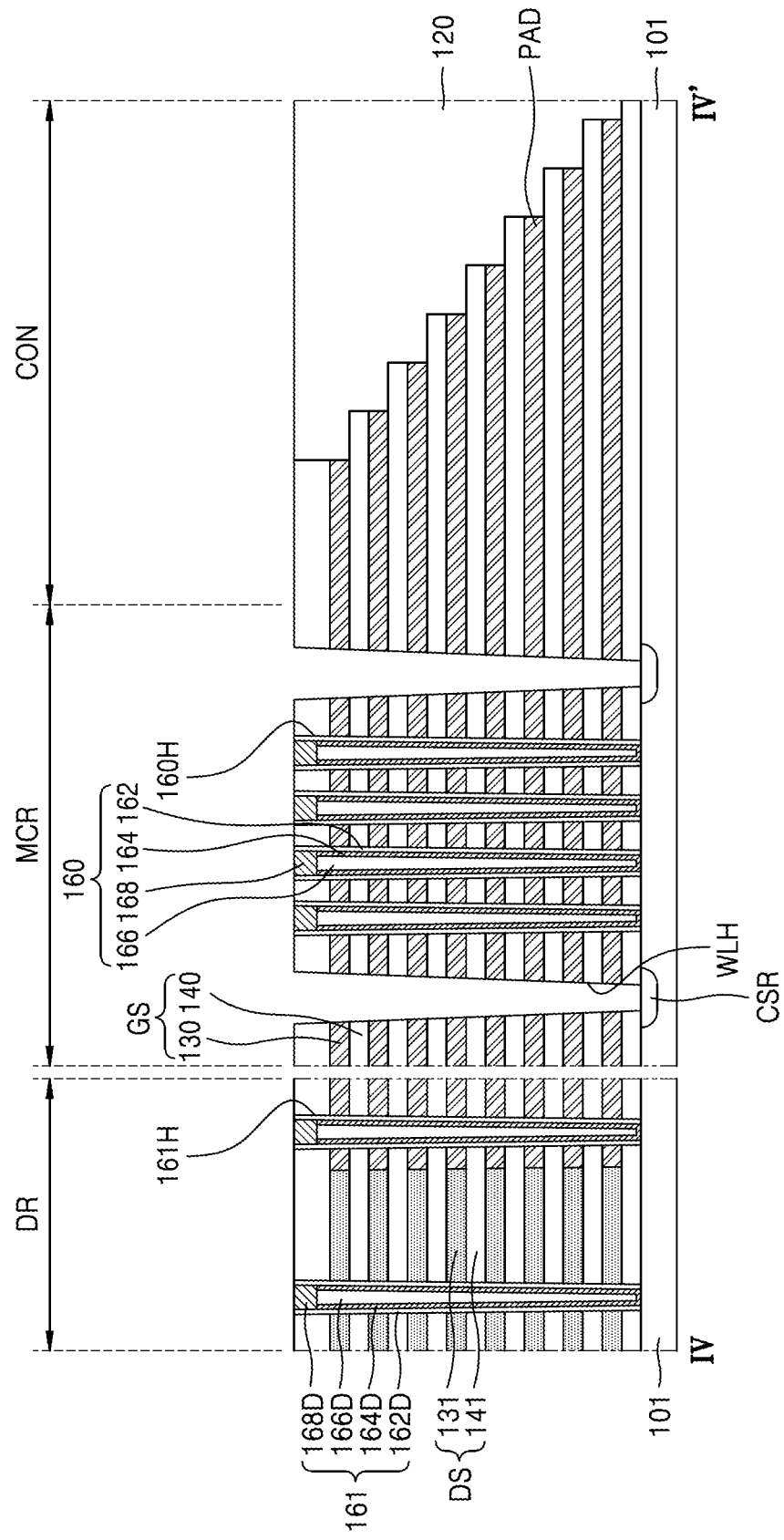

Referring to FIG. 13E, a channel structure 160 may be formed on the inner wall of the channel hole 160H, and a dummy structure 161 may be formed on the inner wall of the dummy hole 161H.

A word line cut opening WLH may be formed by removing a portion of the sacrificial gate stack SGS (see FIG. 13D). A gate electrode 130 may be formed by removing a plurality of mold layers 130M (see FIG. 13B) exposed on the sidewall of the word line cut opening WLH and at least partially filling an electrode layer thereon. That is, a replacement process of forming the gate electrode 130 by replacing the mold layer 130M (see FIG. 13B) with an electrode layer may be performed. Accordingly, the sacrificial gate stack (SGS, see FIG. 13D) may become a gate stack GS.

However, because an etchant used in the replacement process may not completely remove the mold layer 130M (see FIG. 13B) located in the dummy region DR, a portion of the mold layer 130M may remain as a dummy mold layer 131 on the sidewalls of some dummy structures 161.

Referring back to FIG. 4, an upper insulating layer 150 may be formed on the gate stack GS, and a bit line contact BLC passing through the upper insulating layer 150 may be formed. Subsequently, a bit line BL electrically connected to the bit line contact BLC and a conductive line ML electrically connected to a contact plug CNT may be formed on the upper insulating layer 150. That is, by performing the processes described above, the integrated circuit device 100 according to the embodiment of the inventive concept may be completed.

Figure 14:
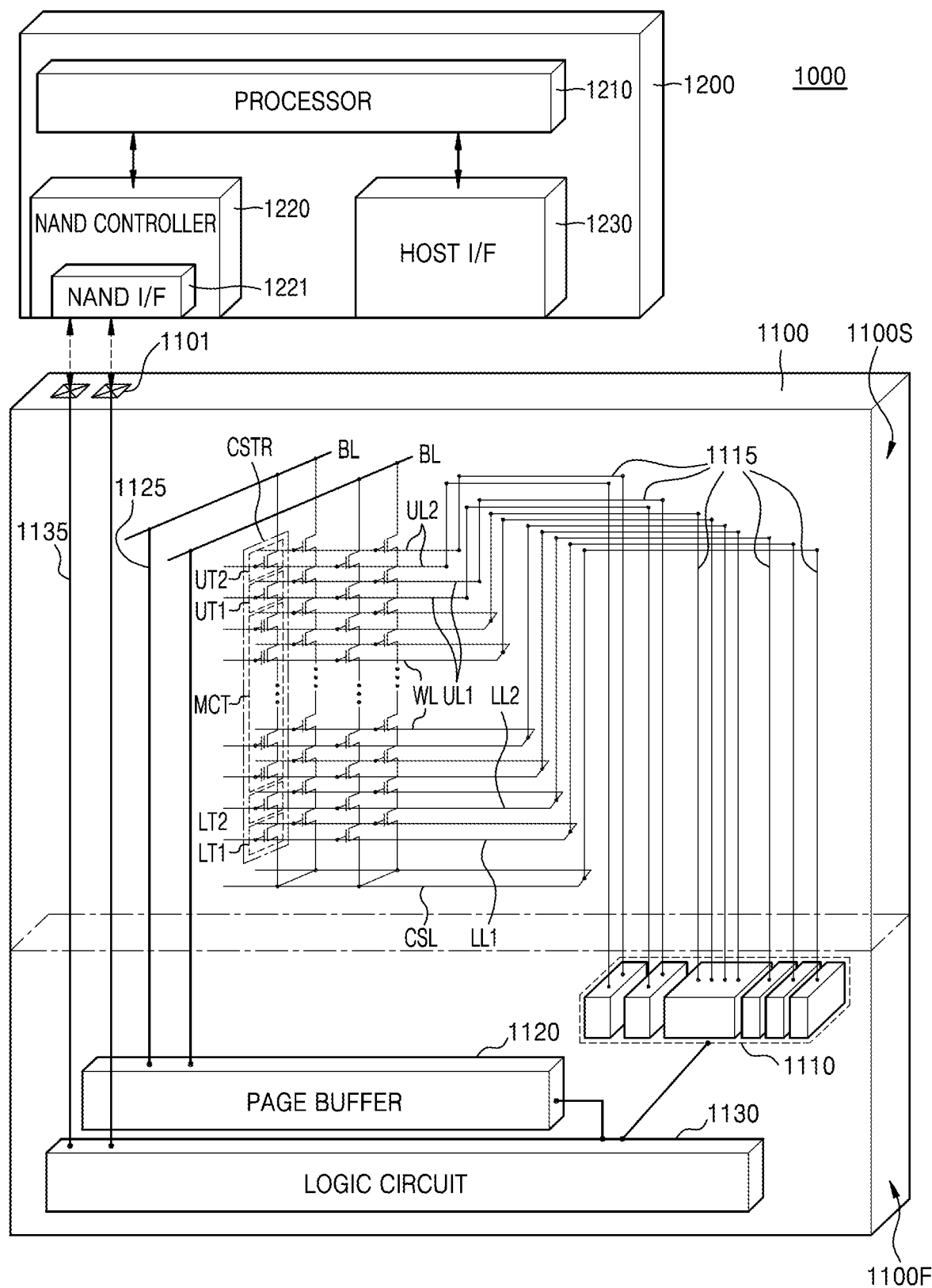
FIG. 14 is a diagram illustrating an electronic system including an integrated circuit device, according to some embodiments of the inventive concept.

FIG. 14 is a diagram illustrating an electronic system 1000 including an integrated circuit device, according to some embodiments of the inventive concept.

Referring to FIG. 14, the electronic system 1000 according to an embodiment may include an integrated circuit device 1100 and a controller 1200 electrically connected to the integrated circuit device 1100.

The electronic system 1000 may include a storage device, including one or a plurality of integrated circuit devices 1100, or an electronic device including a storage device. For example, the electronic system 1000 may include a solid state drive (SSD) device, a universal serial bus (USB) device, a computing system, a medical device, or a communication device, which includes at least one integrated circuit device 1100.

The integrated circuit device 1100 may include a nonvolatile vertical memory device. For example, the integrated circuit device 1100 may include a NAND flash memory device including at least one of the integrated circuit devices 100, 200, 300, and 400 described above with reference to FIGS. 3 to 10. The integrated circuit device 1100 may include a first structure 1100F and a second structure 1100S on the first structure 1100F. In some embodiments, the first structure 1100F may be arranged at one side of the second structure 1100S.

The first structure 1100F may include a peripheral circuit structure that includes a decoder circuit 1110, a page buffer 1120, and a logic circuit 1130. The second structure 1100S may include a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include a plurality of lower transistors LT1 and LT2 adjacent to the common source line CSL, a plurality of upper transistors UT1 and UT2 adjacent to the bit line BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may be variously changed according to different embodiments of the inventive concept.

In some embodiments, the upper transistors UT1 and UT2 may include a string selection transistor, and the lower transistors LT1 and LT2 may include a ground selection transistor. The first and second gate lower lines LL1 and LL2 may respectively be gate electrodes of the lower transistors LT1 and LT2. The word line WL may be a gate electrode of the memory cell transistor MCT, and the first and second gate upper lines UL1 and UL2 may respectively be gate electrodes of the upper transistors UT1 and UT2.

The common source line CSL, the first and second gate lower lines LL1 and LL2, the plurality of word lines WL, and the first and second gate upper lines UL1 and UL2 may be electrically connected to a decoder circuit 1110 through a plurality of first connection wirings 1115 that extend up to the second structure 1100S from an inner portion of the first structure 1100F. The plurality of bit lines BL may be electrically connected to a page buffer 1120 through a plurality of second connection wirings 1125 that extend up to the second structure 1100S from the inner portion of the first structure 1100F.

In the first structure 1100F, the decoder circuit 1110 and the page buffer 1120 may execute a control operation on at least one of the plurality of memory cell transistors MCT. The decoder circuit 1110 and the page buffer 1120 may be controlled by the logic circuit 1130.

The integrated circuit device 1100 may communicate with the controller 1200 through an input/output (I/O) pad 1101 electrically connected to the logic circuit 1130. The I/O pad 1101 may be electrically connected to the logic circuit 1130 through an I/O connection wiring 1135 that extends up to the second structure 1100S from the inner portion of the first structure 1100F.

The controller 1200 may include a processor 1210, a NAND controller 1220, and a host interface 1230. In some embodiments, the electronic system 1000 may include a plurality of integrated circuit devices 1100, and in this case, the controller 1200 may control the plurality of integrated circuit devices 1100.

The processor 1210 may control an overall operation of the electronic system 1000 including the controller 1200. The processor 1210 may operate based on firmware and may control the NAND controller 1220 to access the integrated circuit device 1100. The NAND controller 1220 may include a NAND interface 1221, which manages communication with the integrated circuit device 1100. A control command for controlling the integrated circuit device 1100, data that is to be written in the plurality of memory cell transistors MCT of the integrated circuit device 1100, and data that is to be read from the plurality of memory cell transistors MCT of the integrated circuit device 1100 may be transferred through the NAND interface 1221. The host interface 1230 may provide a communication function between the electronic system 1000 and an external host. When a control command is received from the external host through the host interface 1230, the processor 1210 may control the integrated circuit device 1100 in response to the control command.

Figure 15:
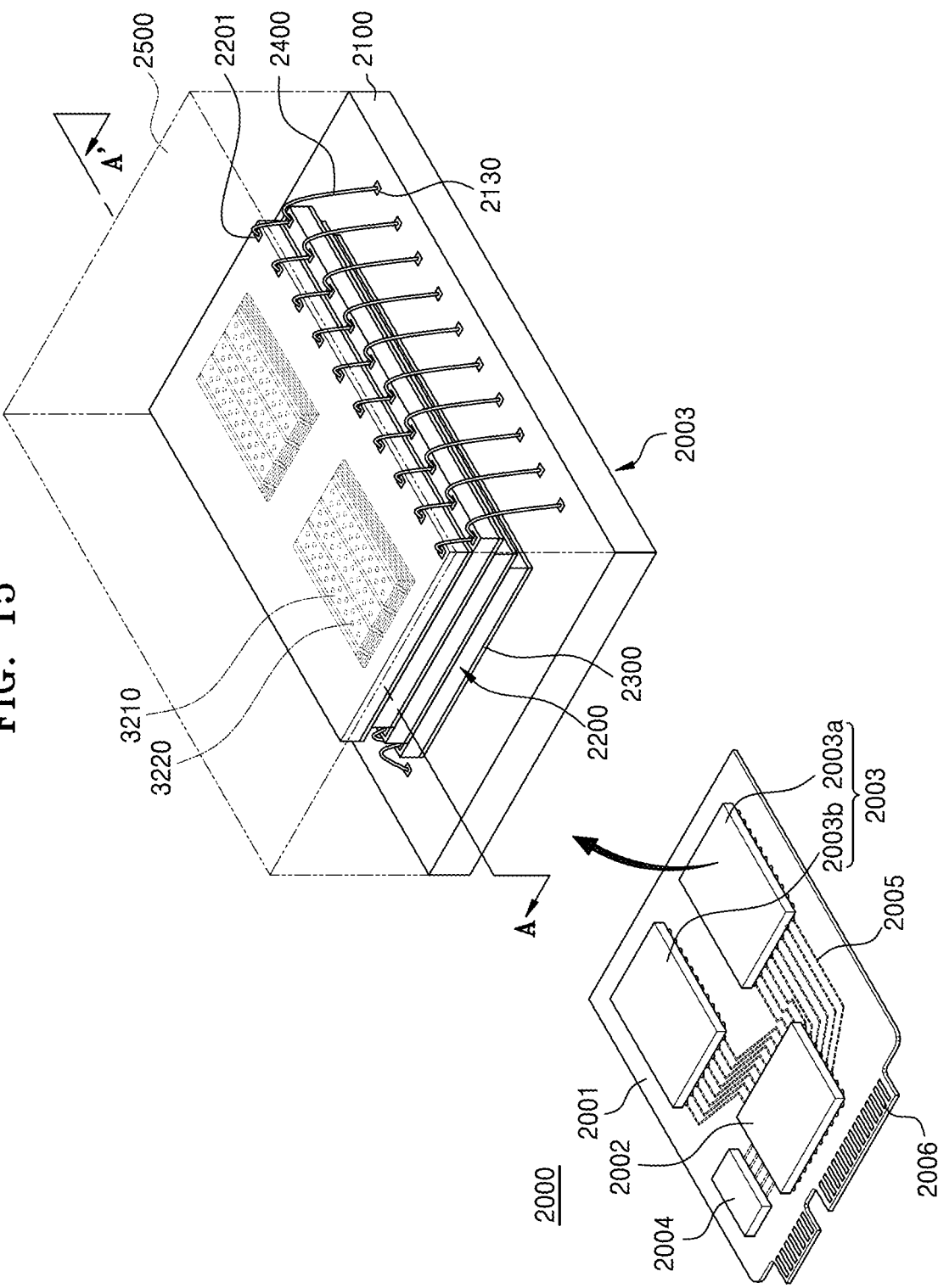
FIG. 15 is a perspective view illustrating an electronic system including an integrated circuit device, according to some embodiments of the inventive concept.

FIG. 15 is a perspective view illustrating an electronic system 2000 including an integrated circuit device, according to some embodiments of the inventive concept.

Referring to FIG. 15, the electronic system 2000 according to an embodiment may include a main board 2001, a controller 2002 mounted on the main board 2001, one or more semiconductor packages 2003, and DRAM 2004.

The main board 2001 may include a connector 2006 including a plurality of pins coupled to the external host. The number and arrangement of pins in the connector 2006 may be changed based on a communication interface between the electronic system 2000 and the external host. In some embodiments, the electronic system 2000 may communicate with the external host on the basis of one or more interfaces, such as USB, peripheral component interconnect express (PCI-Express), serial advanced technology attachment (SATA), and M-Phy for universal flash storage (UFS). In some embodiments, the electronic system 2000 may operate based on power supplied from the external host through the connector 2006. The electronic system 2000 may further include a power management integrated circuit (PMIC) that distributes the power, supplied from the external host, to the controller 2002 and the semiconductor package 2003. The semiconductor package 2003 and the DRAM 2004 may be connected to the controller 2002 by a plurality of wiring patterns 2005 provided on the main board 2001.

The controller 2002 may write data in the semiconductor package 2003 or may read data from the semiconductor package 2003, and may improve an operation speed of the electronic system 2000.

The DRAM 2004 may include a buffer memory for reducing a speed difference between the external host and the semiconductor package 2003, which is a data storage space. The DRAM 2004 included in the electronic system 2000 may operate as a cache memory and may provide a space for arbitrarily storing data in a control operation performed on the semiconductor package 2003. When the DRAM 2004 is included in the electronic system 2000, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are apart from each other. Each of the first and second semiconductor packages 2003a and 2003b may include a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 arranged on a bottom surface of each of the plurality of semiconductor chips 2200, a connection structure 2400 electrically connecting the plurality of semiconductor chips 2200 to the package substrate 2100, and a molding layer 2500, which is on and at least partially covers the plurality of semiconductor chips 2200 and the connection structure 2400 on the package substrate 2100.

The package substrate 2100 may include a printed circuit substrate (PCB) including a plurality of package upper pads 2130. Each of the plurality of semiconductor chips 2200 may include an I/O pad 2201. The I/O pad 2201 may correspond to the I/O pad 1101 of FIG. 14. Each of the plurality of semiconductor chips 2200 may include a plurality of gate stacks 3210 and a plurality of channel structures 3220. Each of the plurality of semiconductor chips 2200 may include at least one the integrated circuit devices 100, 200, 300, and 400 described above with reference to FIGS. 3 to 10.

In some embodiments, the connection structure 2400 may include a bonding wire that electrically connects the I/O pad 2201 to the package upper pad 2130. Therefore, in the first and second semiconductor packages 2003a and 2003b, the plurality of semiconductor chips 2200 may be electrically connected to one another on the basis of a bonding wire manner and may be electrically connected to the package upper pad 2130 of the package substrate 2100. In some embodiments, in the first and second semiconductor packages 2003a and 2003b, the plurality of semiconductor chips 2200 may be electrically connected to one another by a connection structure including a through silicon via (TSV) instead of the connection structure 2400 based on the bonding wire manner.

In some embodiments, the controller 2002 and the plurality of semiconductor chips 2200 may be included in one package. In some embodiments, the controller 2002 and the plurality of semiconductor chips 2200 may be mounted on a separate interposer substrate that differs from the main board 2001, and the controller 2002 and the plurality of semiconductor chips 2200 may be electrically connected to one another by a wiring formed on the interposer substrate.

Figure 16:
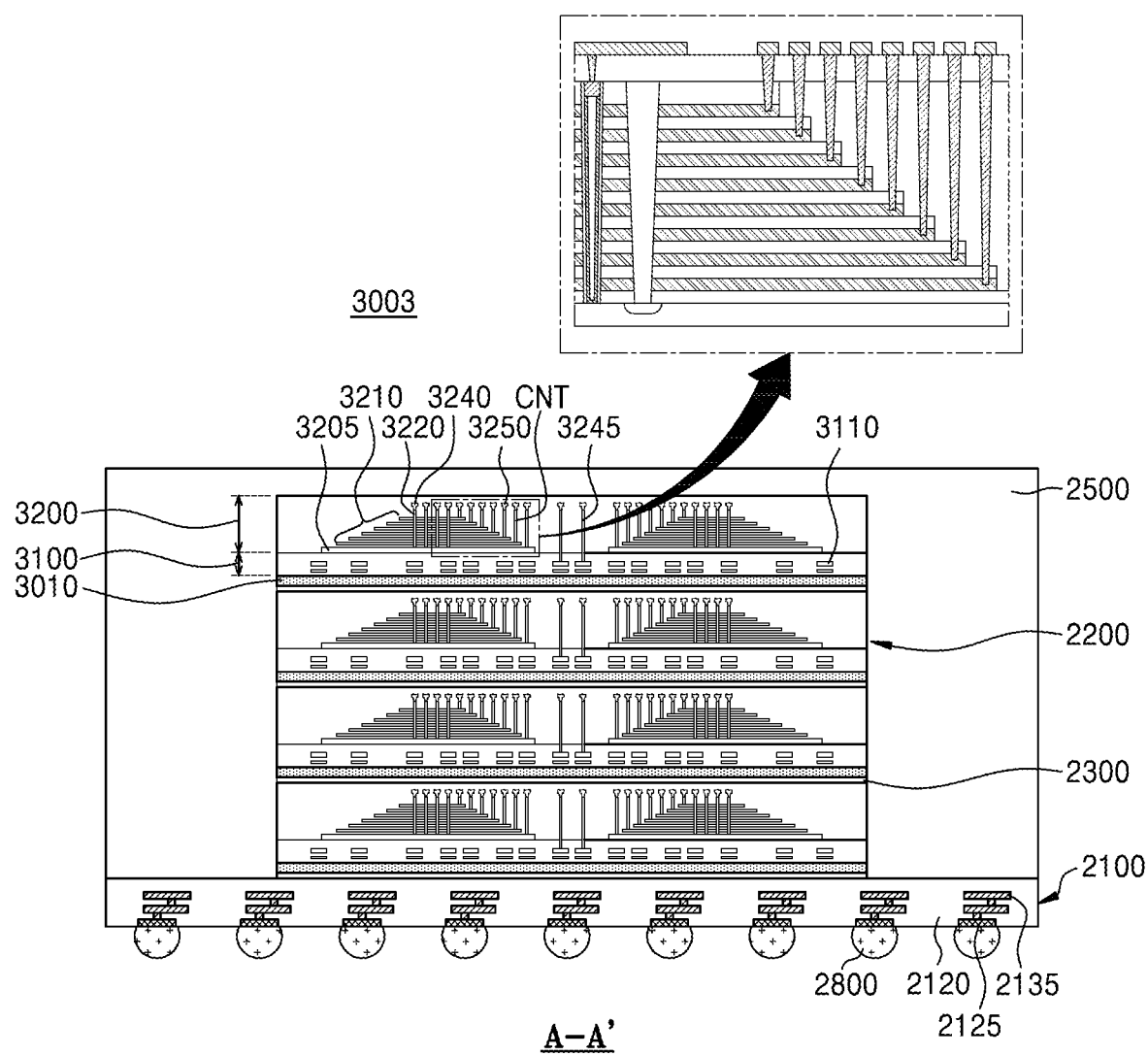
FIGS. 16 and 17 are cross-sectional views respectively illustrating semiconductor packages each including an integrated circuit device, according to some embodiments of the inventive concept.
Figure 17:
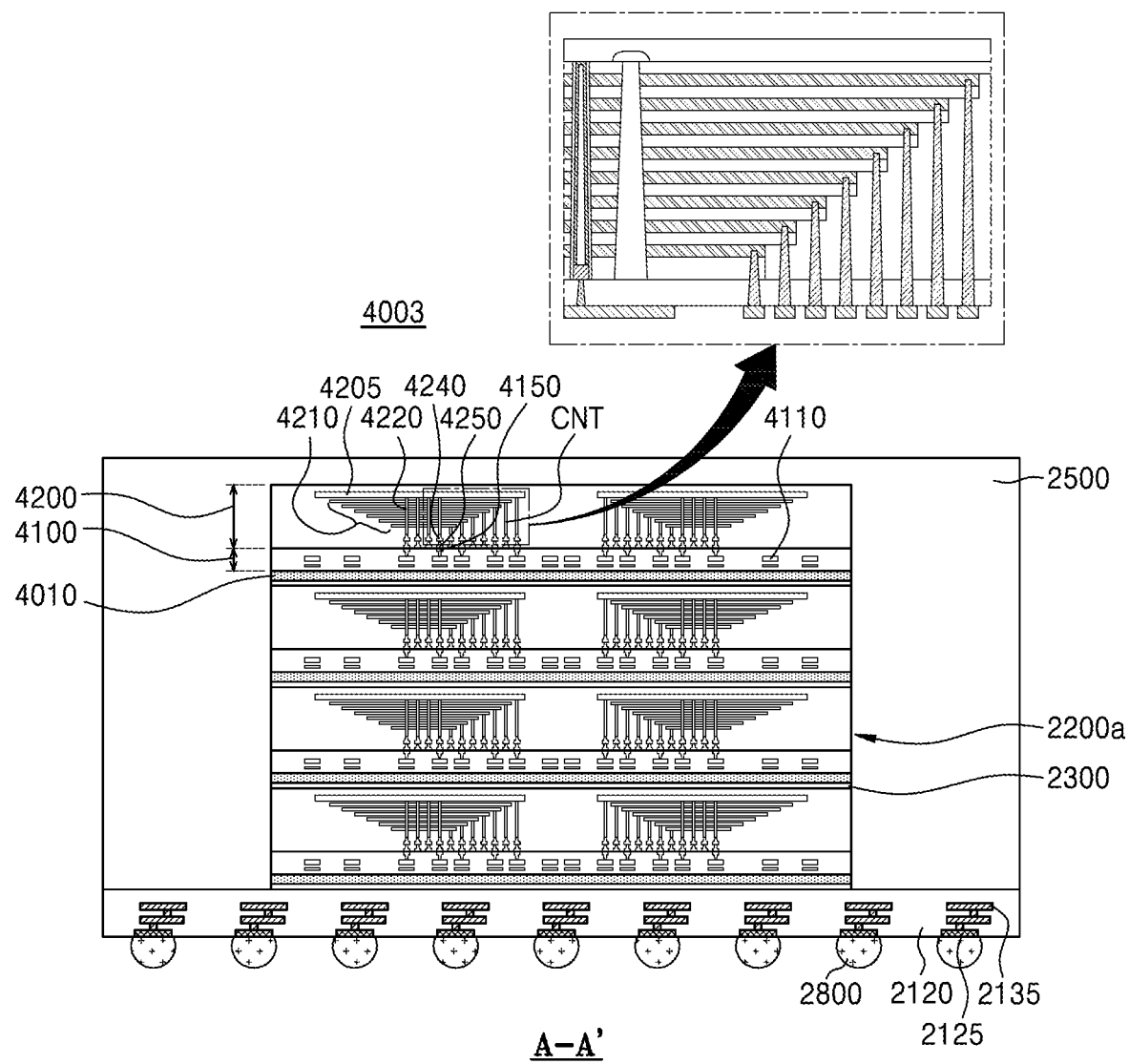

FIGS. 16 and 17 are cross-sectional views illustrating semiconductor packages 3003 and 4003 each including an integrated circuit device, according to some embodiments of the inventive concept.

In detail, in FIGS. 16 and 17, a configuration of a cross-sectional view taken along line A-A' of FIG. 15 is illustrated.

Referring to FIG. 16, in the semiconductor package 3003, a package substrate 2100 may include a PCB.

The package substrate 2100 may include a body portion 2120, a plurality of package upper pads 2130 (see FIG. 15) arranged on the upper surface of the body portion 2120, a plurality of lower pads 2125, which are arranged on or exposed through the bottom surface of the body portion 2120, and a plurality of internal wirings 2135, which electrically connect a plurality of upper pads 2130 to the plurality of lower pads 2125 in the body portion 2120. The plurality of upper pads 2130 may be electrically connected to a plurality of connection structures 2400 (see FIG. 15). The plurality of lower pads 2125 may be connected to, through a plurality of conductive connection parts 2800, the plurality of wiring patterns 2005 on the main board 2001 of the electronic system 2000 illustrated in FIG. 15.

Each of the plurality of semiconductor chips 2200 may include a semiconductor substrate 3010, a first structure 3100, and a second structure 3200, which are sequentially stacked on the semiconductor substrate 3010. The first structure 3100 may include a peripheral circuit region including a plurality of peripheral wirings 3110. The first structure 3100 may include a peripheral circuit transistor 60TR, as described above with reference to FIG. 8. In the drawings, it is illustrated that the first structure 3100 has a structure, such as a peripheral circuit region of the integrated circuit device 200 illustrated in FIG. 8. However, embodiments of the inventive concept are not limited thereto.

The second structure 3200 may include a common source line 3205, a gate stack 3201 on the common source line 3205, a channel structure 3220 passing through the gate stack 3210, and a bit line 3240 electrically connected to the channel structure 3220. The gate stack 3210 may include first and second gate stacks GS1 and GS2 illustrated in FIG. 9. The first and second gate stacks GS1 and GS2 may include a plurality of gate electrodes 130. Also, each of the plurality of semiconductor chips 2200 may include a plurality of contact plugs CNT electrically connected to a gate electrode 130.

Each of the plurality of semiconductor chips 2200 may include a through wiring 3245 that is electrically connected to a plurality of peripheral wirings 3110 of the first structure 3100 and extends to an inner portion of the second structure 3200. The through wiring 3245 may be arranged outside the gate stack 3210. In other embodiments, the semiconductor package 3003 may further include a through wiring that passes through the gate stack 3210. Each of the plurality of semiconductor chips 2200 may further include an I/O pad 2201 (see FIG. 15) electrically connected to the plurality of peripheral wirings 3110 of the first structure 3100.

Referring to FIG. 17, the semiconductor package 4003 has a configuration similar to that of the semiconductor package 3003 described with reference to FIG. 16. However, the semiconductor package 4003 includes a plurality of semiconductor chips 2200a.

Each of the plurality of semiconductor chips 2200a may include a semiconductor substrate 4010, a first structure 4100 on the semiconductor substrate 4010, and a second structure 4200 on the first structure 4100, the second structure 4200 being bonded to the first structure 4100 by a wafer bonding method.

The first structure 4100 may include a peripheral circuit region including a peripheral wiring 4110 and a plurality of first bonding structures 4150. As described with reference to FIG. 8, the first structure 4100 may include a peripheral circuit transistor 60TR. In the drawings, it is illustrated that the first structure 4100 has the same structure as a peripheral circuit region of the integrated circuit device 200 illustrated in FIG. 8. However, embodiments of the inventive concept are not limited thereto.

The second structure 4200 may include a common source line 4205, a gate stack 4210 between the common source line 4205 and the first structure 4100, and a channel structure 4220 passing through the gate stack 4210. The gate stack 4210 may include first and second gate stacks GS1 and GS2 illustrated in FIG. 9. The first and second gate stacks GS1 and GS2 may include a plurality of gate electrodes 130. In addition, each of the plurality of semiconductor chips 2200a may include a plurality of contact plugs CNT electrically connected to a gate electrode 130.

In addition, each of the plurality of semiconductor chips 2200a may include a plurality of second bonding structures 4250 electrically connected to the plurality of gate electrodes 130 of the gate stack 4210, respectively. For example, some of the plurality of second bonding structures 4250 may be configured to be connected to a bit line 4240 electrically connected to the channel structure 4220. The others of the plurality of second bonding structures 4250 may be configured to be electrically connected to a gate electrode 130 through a plurality of contact plugs CNT.

The plurality of first bonding structures 4150 of the first structure 4100 and the plurality of second bonding structures 4250 of the second structure 4200 may be bonded to each other while physically contacting each other. Bonding portions of the plurality of first bonding structures 4150 and the plurality of second bonding structures 4250 may include a metal, for example, copper (Cu), but embodiments of the inventive concept are not limited thereto.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a semiconductor substrate having a cell region and a dummy region outside the cell region;
   a plurality of gate electrodes and a plurality of insulating layers, in the cell region, extending in first and second directions parallel to a main surface of the semiconductor substrate and alternately stacked in a third direction perpendicular to the main surface of the semiconductor substrate, the first and second directions crossing each other;
   a plurality of dummy mold layers and a plurality of dummy insulating layers alternately stacked in the dummy region in the third direction;
   a plurality of channel structures passing through the plurality of gate electrodes and the plurality of insulating layers in the cell region; and
   a plurality of dummy structures passing through the plurality of dummy mold layers and the plurality of dummy insulating layers in the dummy region,
   wherein the plurality of dummy mold layers are arranged at a same level as the plurality of gate electrodes in the third direction,
   wherein the plurality of dummy insulating layers are arranged at a same level as the plurality of insulating layers in the third direction, and
   wherein a carbon concentration of an upper dummy mold layer of the plurality of dummy mold layers is less than a carbon concentration of a lower dummy mold layer of the plurality of dummy mold layers, the lower dummy mold layer being between the upper dummy mold layer and the main surface of the semiconductor substrate.

2. The integrated circuit device of claim 1, wherein the carbon concentration of the upper dummy mold layer is about 0% to about 80% of the carbon concentration of the lower dummy mold layer.

3. The integrated circuit device of claim 1, wherein, in the dummy region, the carbon concentration of the dummy mold layers and the dummy insulating layers is distributed in a form of a sine wave in the third direction from the main surface of the semiconductor substrate.

4. The integrated circuit device of claim 1, wherein carbon and hydrogen are present as impurities at interfaces between the plurality of gate electrodes and the plurality of insulating layers.

5. The integrated circuit device of claim 1, wherein, in at least one dummy mold layer of the plurality of dummy mold layers, a carbon concentration at each of an upper interface and a lower interface of the at least one dummy mold layer is greater than a carbon concentration of a central portion of the at least one dummy mold layer.

6. The integrated circuit device of claim 5, wherein the carbon concentration at the upper interface of the at least one dummy mold layer is greater than the carbon concentration at the lower interface of the at least one dummy mold layer, the lower interface of the at least one dummy mold layer being between the upper interface of the at least one dummy mold layer and the main surface of the semiconductor substrate.

7. The integrated circuit device of claim 5, wherein, the carbon concentration at the upper interface of the at least one dummy mold layer is about 5 times or more the carbon concentration of the central portion of the at least one dummy mold layer, the lower interface of the at least one dummy mold layer being between the upper interface of the at least one dummy mold layer and the main surface of the semiconductor substrate.

8. The integrated circuit device of claim 1, wherein a distance between adjacent channel structures of the plurality of channel structures is less than a distance between adjacent dummy structures of the plurality of dummy structures.

9. The integrated circuit device of claim 1, wherein each of the plurality of gate electrodes includes a first conductive material,
wherein at least portions of sidewalls of the plurality of dummy mold layers physically contact the first conductive material.

10. The integrated circuit device of claim 1, wherein the plurality of gate electrodes and the plurality of insulating layers constitute a gate stack,
wherein the integrated circuit device further comprises a peripheral circuit structure arranged between the semiconductor substrate and the gate stack.

11. An integrated circuit device comprising:
a semiconductor substrate having a cell region and a dummy region;
a plurality of gate electrodes and a plurality of insulating layers alternately stacked in the cell region in a direction perpendicular to a main surface of the semiconductor substrate;
a plurality of dummy mold layers and a plurality of dummy insulating layers alternately stacked in the dummy region in the direction perpendicular to the main surface of the semiconductor substrate; and
a channel hole passing through the plurality of gate electrodes and the plurality of insulating layers in the cell region, and a dummy hole passing through the plurality of dummy mold layers and the plurality of dummy insulating layers in the dummy region,
wherein, in at least one dummy mold layer of the plurality of dummy mold layers, a carbon concentration at each of an upper interface and a lower interface of the at least one dummy mold layer is greater than a carbon concentration of a central portion of the at least one dummy mold layer.

12. The integrated circuit device of claim 11, wherein the upper interface of the at least one dummy mold layer is a surface in which a lower surface of a first dummy insulating layer of the plurality of dummy insulating layers and an upper surface of the at least one dummy mold layer physically contact each other, and
the lower interface of the at least one dummy mold layer is a surface in which a lower surface of the at least one dummy mold layer and an upper surface of a second dummy insulating layer of the plurality of dummy insulating layers physically contact each other.

13. The integrated circuit device of claim 11, wherein the plurality of dummy mold layers are arranged at a same level as the plurality of gate electrodes in the direction perpendicular to the main surface of the semiconductor substrate, and
a carbon concentration of an upper dummy mold layer of the plurality of dummy mold layers is less than a carbon concentration of a lower dummy mold layer of the plurality of dummy mold layers, the lower dummy mold layer being between the upper dummy mold layer and the main surface of the semiconductor substrate.

14. The integrated circuit device of claim 13, wherein, in the cell region and the dummy region, an annealing process using ultraviolet rays is performed at a level in the direction perpendicular to the main surface of the semiconductor substrate in which the upper dummy mold layer is arranged.

15. The integrated circuit device of claim 13, wherein, in the cell region and the dummy region, a plasma process using oxygen is performed at a level in the direction perpendicular to the main surface of the semiconductor substrate in which the upper dummy mold layer is arranged.

16. The integrated circuit device of claim 11, wherein the plurality of insulating layers include a same material as the plurality of dummy insulating layers,
wherein the plurality of dummy mold layers include a material that is different from that of the plurality of dummy insulating layers,
wherein the plurality of gate electrodes include a conductive material, and
wherein sidewalls of the plurality of dummy mold layers physically contact the conductive material.

17. The integrated circuit device of claim 11, wherein the channel hole and the dummy hole each have a tapered shape narrowing in width from an upper region to a lower region thereof, the lower region being between the upper region and the main surface of the semiconductor substrate.

18. The integrated circuit device of claim 11, further comprising:
a circuit substrate having a peripheral circuit and a first bonding pad above the peripheral circuit; and
a second bonding pad arranged above the plurality of gate electrodes and the plurality of insulating layers,
wherein the first bonding pad and the second bonding pad physically contact each other.

19. An electronic system comprising:
a main substrate;
an integrated circuit device on the main substrate; and
a controller electrically connected to the integrated circuit device on the main substrate,
wherein the integrated circuit device includes:
a semiconductor substrate having a cell region and a dummy region outside the cell region;
a plurality of gate electrodes and a plurality of insulating layers, in the cell region, extending in first and second directions parallel to a main surface of the semiconductor substrate and alternately stacked in a third direction perpendicular to the main surface of the semiconductor substrate, the first and second directions crossing each other;
a plurality of dummy mold layers and a plurality of dummy insulating layers alternately stacked in the dummy region in the third direction;
a plurality of channel structures passing through the plurality of gate electrodes and the plurality of insulating layers in the cell region; and
a plurality of dummy structures passing through the plurality of dummy mold layers and the plurality of dummy insulating layers in the dummy region,
wherein the plurality of dummy mold layers are arranged at a same level as the plurality of gate electrodes in the third direction,
wherein the plurality of dummy insulating layers are arranged at a same level as the plurality of insulating layers in the third direction, and wherein a carbon concentration of an upper dummy mold layer of the plurality of dummy mold layers is less than a carbon concentration of a lower dummy mold layer of the plurality of dummy mold layers, the lower dummy mold layer being between the upper dummy mold layer and the main surface of the semiconductor substrate.

20. The electronic system of claim 19, wherein the main substrate includes wiring patterns electrically connecting the integrated circuit device to the controller,
wherein, in the dummy region, a carbon concentration of the dummy mold layers and the dummy insulating layers is distributed in a form of a sine wave in the third direction from the main surface of the semiconductor substrate.

* * * * *